(12) United States Patent
Cheng et al.

(10) Patent No.: US 9,318,584 B2
(45) Date of Patent: Apr. 19, 2016

(54) ISOLATION SCHEME FOR BIPOLAR TRANSISTORS IN BICMOS TECHNOLOGY

(71) Applicant: GLOBALFOUNDRIES INC., Grand Cayman (KY)

(72) Inventors: Peng Cheng, South Burlington, VT (US); Peter B. Gray, Jericho, VT (US); Vibhor Jain, Essex Junction, VT (US); Robert K. Leidy, Burlington, VT (US); Qizhi Liu, Lexington, MA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/492,582

(22) Filed: Sep. 22, 2014

(65) Prior Publication Data
US 2015/0041956 A1 Feb. 12, 2015

Related U.S. Application Data

(62) Division of application No. 13/661,359, filed on Oct. 26, 2012, now Pat. No. 8,921,195.

(51) Int. Cl.
| | |
|---|---|
| *H01L 29/732* | (2006.01) |
| *H01L 29/66* | (2006.01) |
| *H01L 29/737* | (2006.01) |
| *H01L 21/762* | (2006.01) |

(52) U.S. Cl.
CPC ........ *H01L 29/732* (2013.01); *H01L 21/76229* (2013.01); *H01L 21/76283* (2013.01); *H01L 29/66242* (2013.01); *H01L 29/7378* (2013.01)

(58) Field of Classification Search
CPC ............ H01L 29/732; H01L 21/76229; H01L 21/76283; H01L 29/66242; H01L 29/7378
USPC .......................................................... 257/565
See application file for complete search history.

(56) References Cited

U.S. PATENT DOCUMENTS

| | | | |
|---|---|---|---|
| 4,435,899 | A | 3/1984 | Soclof |
| 4,437,226 | A | 3/1984 | Soclof |
| 4,764,801 | A | 8/1988 | McLaughlin et al. |
| 4,824,799 | A | 4/1989 | Komatsu |

(Continued)

OTHER PUBLICATIONS

Notice of Allowance issued in U.S. Appl. No. 13/661,359 dated Aug. 22, 2014.

(Continued)

*Primary Examiner* — Peter Bradford
(74) *Attorney, Agent, or Firm* — Thompson Hine LLP; Anthony J. Canale

(57) ABSTRACT

Device structures and design structures for a bipolar junction transistor. The device structure includes a collector region in a substrate, a plurality of isolation structures extending into the substrate and comprised of an electrical insulator, and an isolation region in the substrate. The isolation structures have a length and are arranged with a pitch transverse to the length such that each adjacent pair of the isolation structures is separated by a respective section of the substrate. The isolation region is laterally separated from at least one of the isolation structures by a first portion of the collector region. The isolation region laterally separates a second portion of the collector region from the first portion of the collector region. The device structure further includes an intrinsic base on the second portion of the collector region and an emitter on the intrinsic base. The emitter has a length transversely oriented relative to the length of the isolation structures.

19 Claims, 19 Drawing Sheets

(56) References Cited

U.S. PATENT DOCUMENTS

| | | | |
|---|---|---|---|
| 5,411,898 A | 5/1995 | Kinoshita et al. | |
| 6,001,700 A | 12/1999 | Peidous | |
| 6,475,848 B1 | 11/2002 | Darwish et al. | |
| 6,607,960 B2 | 8/2003 | Gris et al. | |
| 6,624,497 B2 | 9/2003 | Beasom | |
| 2003/0193077 A1* | 10/2003 | Fujii | H01L 21/8222 257/656 |
| 2009/0160016 A1 | 6/2009 | Arai et al. | |
| 2012/0087181 A1 | 4/2012 | Lung et al. | |
| 2013/0277753 A1* | 10/2013 | Clark, Jr. | H01L 27/1203 257/378 |
| 2014/0017871 A1* | 1/2014 | Fenouillet-Beranger | H01L 29/66234 438/311 |

OTHER PUBLICATIONS

USPTO, Office Action issued in U.S. Appl. No. 13/661,359 dated Jul. 29, 2014.

USPTO, Office Action issued in U.S. Appl. No. 13/661,359 dated Apr. 9, 2014.

* cited by examiner

US 9,318,584 B2

ISOLATION SCHEME FOR BIPOLAR TRANSISTORS IN BICMOS TECHNOLOGY

BACKGROUND

The invention relates generally to semiconductor device fabrication and, in particular, to bipolar junction transistors, fabrication methods for bipolar junction transistors, and design structures for a bipolar junction transistor.

Bipolar junction transistors are typically found in demanding types of integrated circuits, especially integrated circuits destined for high-frequency applications. One specific application for bipolar junction transistors is in radiofrequency integrated circuits (RFICs), which are found in wireless communications systems, power amplifiers in cellular telephones, and other varieties of high-speed integrated circuits. Bipolar junction transistors may also be combined with complementary metal-oxide-semiconductor (CMOS) field effect transistors in bipolar complementary metal-oxide-semiconductor (BiCMOS) integrated circuits, which take advantage of the positive characteristics of both transistor types in the construction of the integrated circuit.

A bipolar junction transistor is a three-terminal electronic device that includes three semiconductor regions, namely an emitter, a base, and a collector. An NPN bipolar junction transistor includes two regions of n-type semiconductor material constituting the emitter and collector, and a region of p-type semiconductor material sandwiched between the two regions of n-type semiconductor material to constitute the base. A PNP bipolar junction transistor has two regions of p-type semiconductor material constituting the emitter and collector, and a region of n-type semiconductor material sandwiched between two regions of p-type semiconductor material to constitute the base. Generally, the differing conductivity types of the emitter, base, and collector form a pair of p-n junctions, namely a collector-base junction and an emitter-base junction. A voltage applied across the emitter-base junction of a bipolar junction transistor controls the movement of charge carriers that produce charge flow between the collector and emitter regions.

Improved device structures, fabrication methods, and design structures are needed for bipolar junction transistors that enhance device performance.

SUMMARY

In an embodiment of the invention, a method is provided for fabricating a bipolar junction transistor. The method includes forming a collector region in a substrate, forming an intrinsic base layer on the collector region, and forming a plurality of trenches extending into the substrate. The trenches have a length and are arranged with a pitch transverse to the length such that each adjacent pair of the trenches is separated by a respective section of the substrate. The trenches are at least partially filling with an electrical insulator to define a plurality of isolation structures. The method further includes forming an emitter of the bipolar junction transistor coupled by the intrinsic base layer with a portion of the collector region. The emitter has a length transversely oriented relative to the length of the trenches.

In an embodiment of the invention, a device structure is provided for a bipolar junction transistor. The device structure includes a collector region in a substrate and a plurality of isolation structures extending into the substrate. The isolation structures are comprised of an electrical insulator, have a length, and are arranged with a pitch transverse to the length such that each adjacent pair of the isolation structures is separated by a respective section of the substrate. The device structure further includes an intrinsic base on a portion of the collector region and an emitter on the intrinsic base. The emitter has a length transversely oriented relative to the length of the isolation structures.

In an embodiment of the invention, a hardware description language (HDL) design structure is encoded on a machine-readable data storage medium. The HDL design structure comprises elements that, when processed in a computer-aided design system, generates a machine-executable representation of a device structure for a bipolar junction transistor. The HDL design structure includes a collector region in a substrate and a plurality of isolation structures extending into the substrate. The isolation structures are comprised of an electrical insulator, have a length, and are arranged with a pitch transverse to the length such that each adjacent pair of the isolation structures is separated by a respective section of the substrate. The design structure further includes an intrinsic base on a portion of the collector region and an emitter on the intrinsic base. The emitter has a length transversely oriented relative to the length of the isolation structures. The HDL design structure may comprise a netlist. The HDL design structure may also reside on storage medium as a data format used for the exchange of layout data of integrated circuits. The HDL design structure may reside in a programmable gate array.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

FIG. 2B is a top view of the substrate in which FIG. 2 is generally taken along line 2-2 and FIG. 2A is taken generally along line 2A-2A.

FIG. 4B is a top view of the substrate in which FIG. 4 is generally taken along line 4-4 and FIG. 4A is taken generally along line 4A-4A.

DETAILED DESCRIPTION

Figure 1:
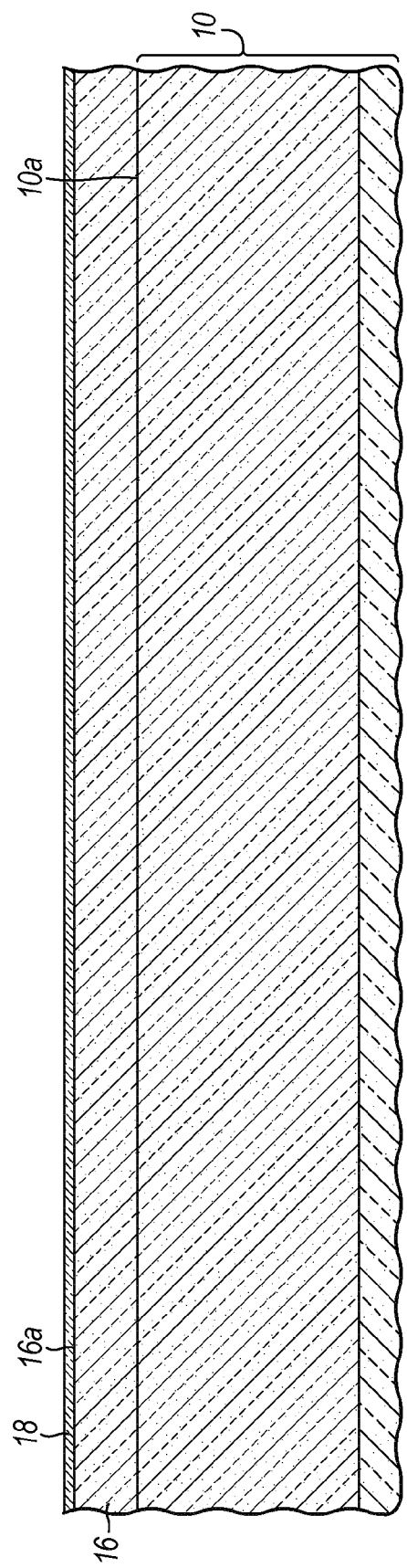
FIGS. 1-9 are cross-sectional views of a portion of a substrate at successive fabrication stages of a processing method for fabricating a device structure in accordance with an embodiment of the invention.

With reference to FIG. 1 and in accordance with an embodiment of the invention, a substrate 10 may be any suitable bulk substrate comprising a semiconductor material that a person having ordinary skill in the art would recognize as suitable for forming an integrated circuit. For example, substrate 10 may be comprised of a wafer of a monocrystalline silicon-containing material, such as single crystal silicon with a (100) crystal lattice orientation. The semiconductor material comprising substrate 10 may be lightly doped with an impurity to alter its electrical properties and may also include an optional epitaxial layer.

Figure 2:
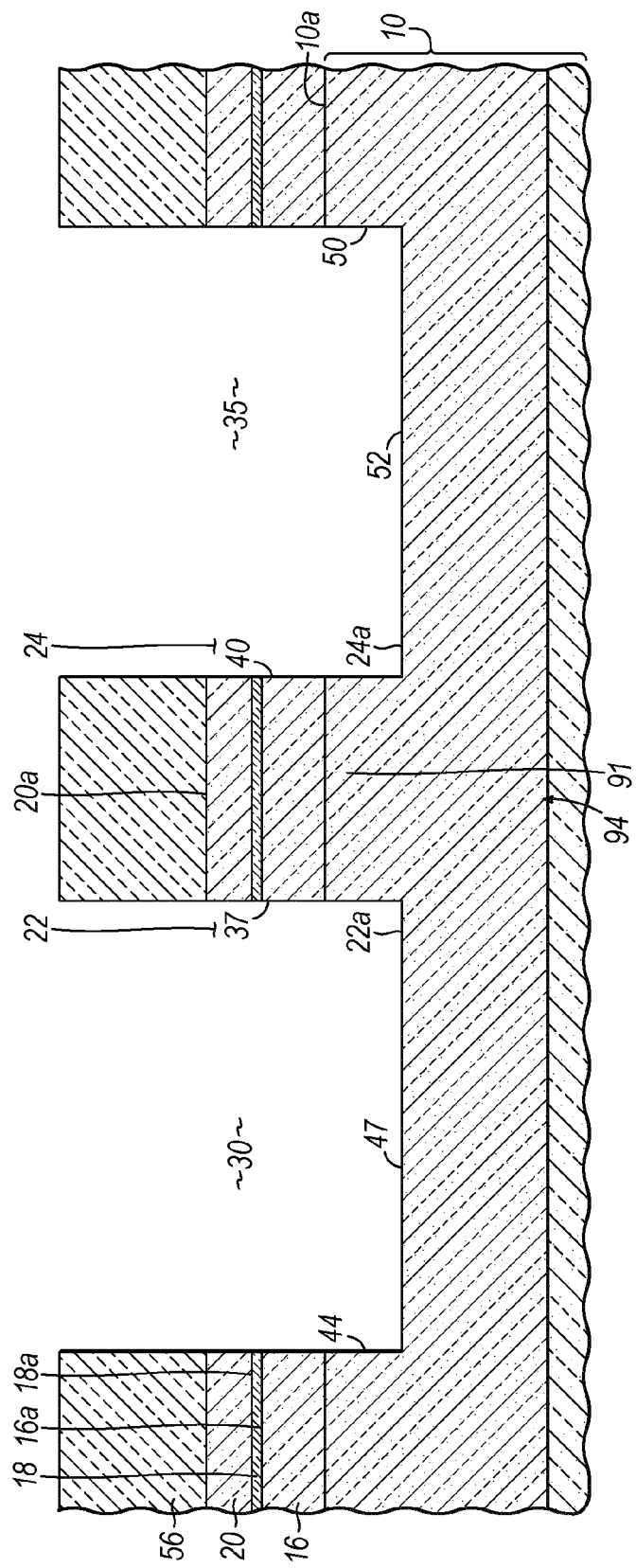
Figure 2A:
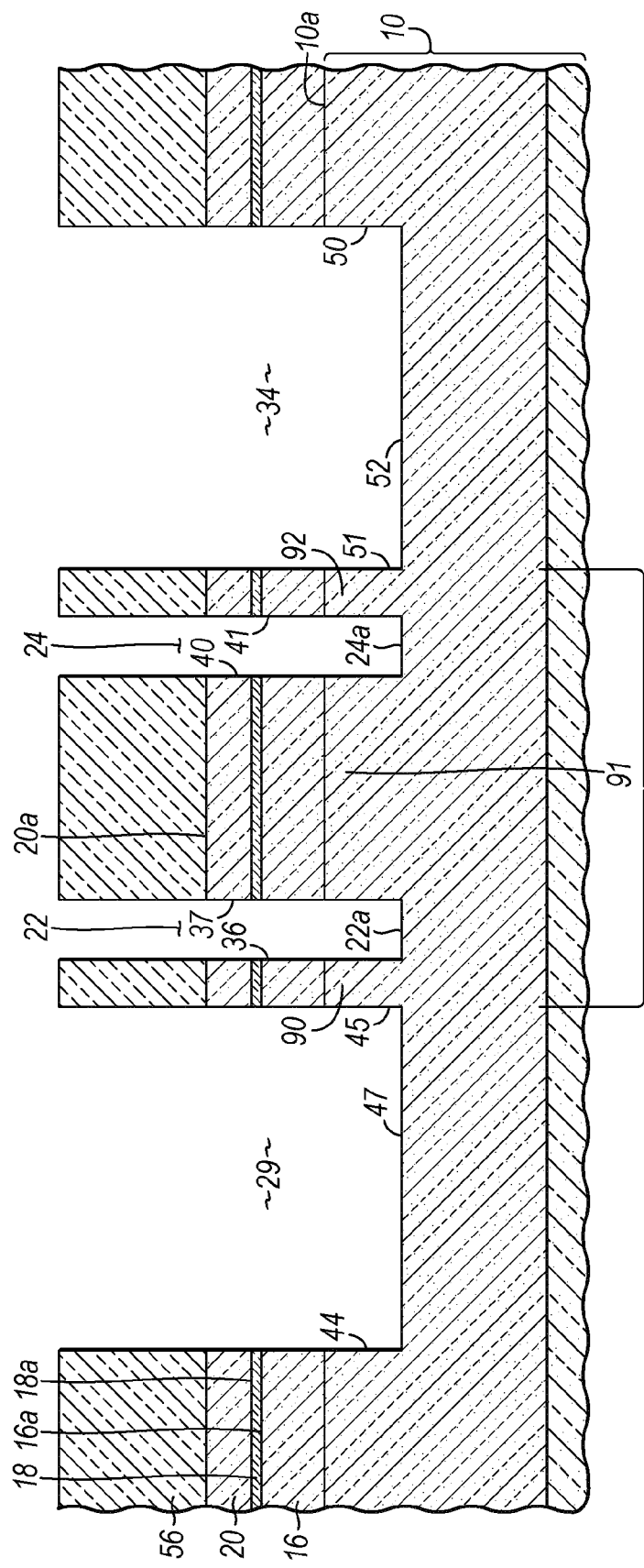
FIG. 2A is a cross-sectional view of a different portion of the substrate at the fabrication stage of FIG. 2.
Figure 2B:
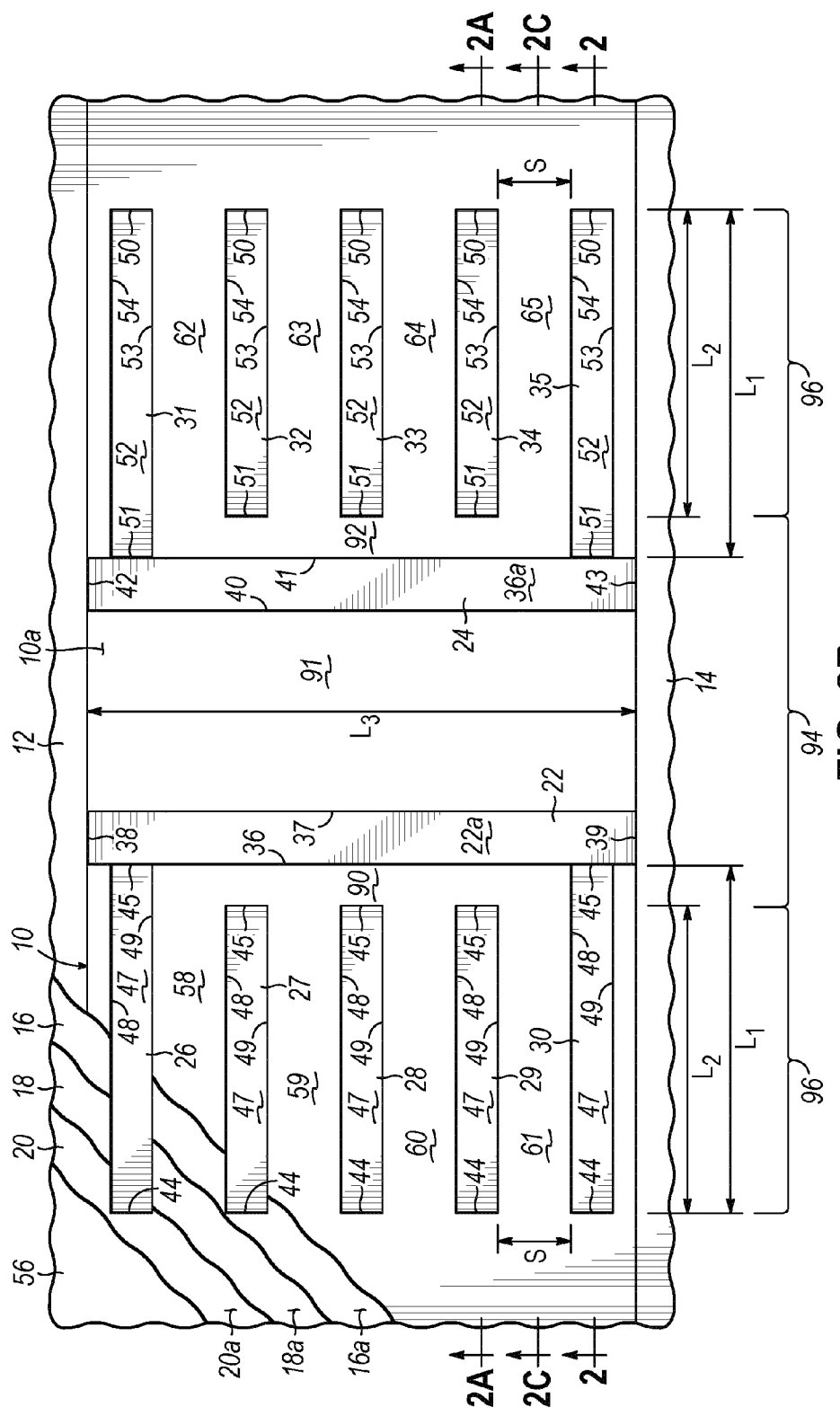
Figure 2C:
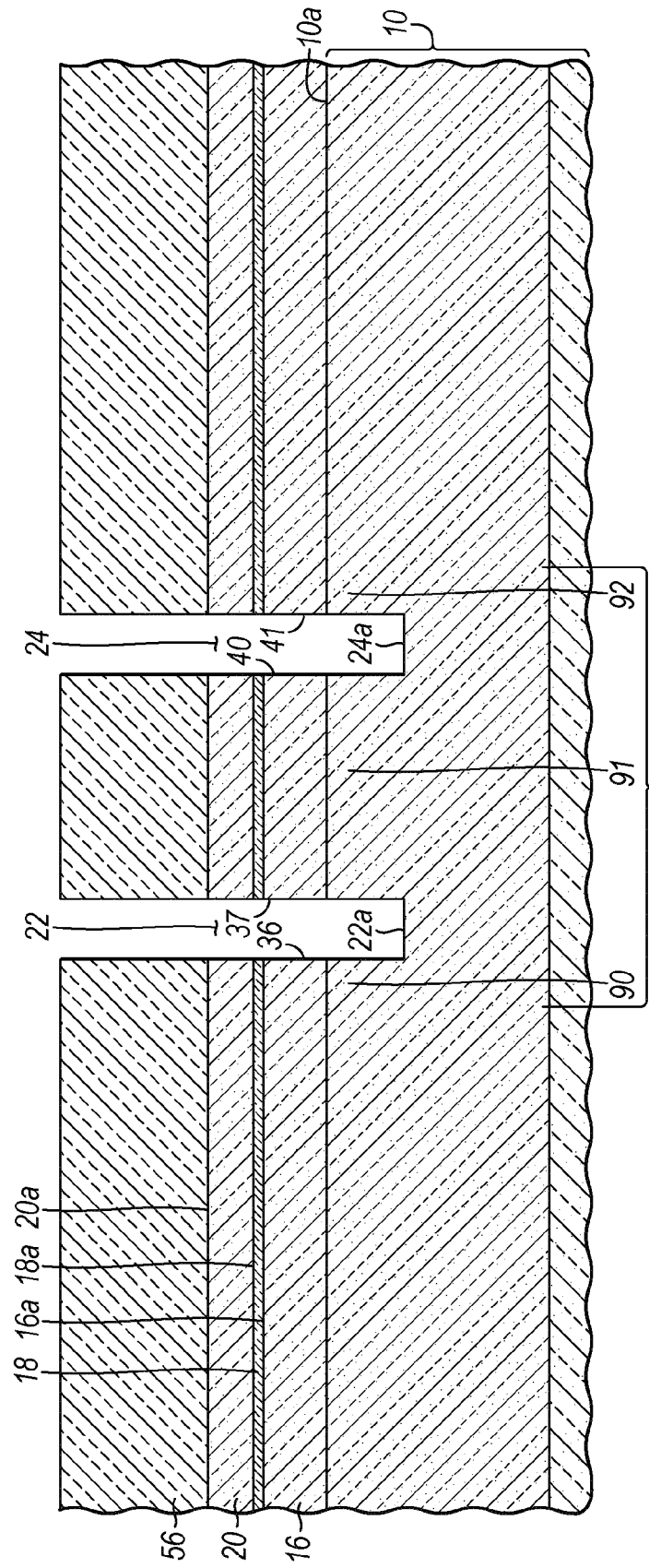
FIG. 2C is a cross-sectional view taken generally along line 2C-2C in FIG. 2B.

Trench isolation regions 12, 14 (FIG. 2B) are formed in the substrate. The trench isolation regions 12, 14 are discontinuous and arranged as parallel structures. The trench isolation regions 12, 14 may be isolation structures formed by a shallow trench isolation (STI) technique that relies on a lithography and dry etching process to define closed-bottomed trenches in substrate 10, deposit an electrical insulator to fill the trenches, and planarize the electrical insulator relative to the top surface 10a of the substrate 10 using a chemical mechanical polishing (CMP) process. The dielectric may be comprised of an oxide of silicon, such as densified tetraethylorthosilicate (TEOS) deposited by chemical vapor deposition (CVD).

The conductivity of the substrate 10 near the top surface 10a is modified by introducing an electrically-active dopant, such as an impurity species from Group V of the Periodic Table (e.g., phosphorus (P), arsenic (As), or antimony (Sb)) effective to impart an n-type conductivity in which electrons are the majority carriers and dominate the electrical conductivity of the host semiconductor material. In one embodiment, separate ion implantations of n-type impurity species may be used to introduce the dopant at different depths in the substrate and, thereafter, an anneal may activate the impurity species and alleviate implantation damage. One implantation may be a high-current ion implantation followed by a lengthy, high temperature thermal anneal that dopes a surface layer of the substrate 10 before an optional epitaxial layer is formed. Another implantation may comprise a selectively implanted collector (SIC). An anneal may be used to cause the dopant of this implantation to diffuse laterally and vertically such that a surface layer of the substrate 10 becomes impurity doped and, as a result, is structurally and electrically continuous with the more deeply-doped layer from the initial high-current ion implantation.

An intrinsic base layer 16, which is comprised of a material suitable for forming an intrinsic base of a bipolar junction transistor, is formed a continuous additive layer on a top surface 10a of substrate 10. In the representative embodiment, the intrinsic base layer 16 directly contacts the top surface 10a of the substrate 10 and also directly contacts a top surface of the trench isolation regions 12, 14. Because trench isolation regions are absent over regions of the substrate 10 laterally bounded on two sides only by the trench isolation regions 12, 14, the intrinsic base layer 16 is of a uniform thickness where in direct contact with the top surface 10a of substrate 10 and comprises single crystal semiconductor material.

The intrinsic base layer 16 may be comprised of a semiconductor material, such as silicon-germanium (SiGe) including silicon (Si) and germanium (Ge) in an alloy with the silicon content ranging from 95 atomic percent to 50 atomic percent and the germanium content ranging from 5 atomic percent to 50 atomic percent. The germanium content of the intrinsic base layer 16 may be uniform or the germanium content of intrinsic base layer 16 may be graded or stepped across its thickness. Alternatively, the intrinsic base layer 16 may be comprised of a different semiconductor material, such as silicon (Si). The intrinsic base layer 16 may be doped with one or more impurity species, such as boron and/or carbon.

Intrinsic base layer 16 may be formed after the trench isolation regions 12, 14 are formed using a low temperature epitaxial (LTE) growth process, such as vapor phase epitaxy (VPE) that may be conducted at a growth temperature ranging from 400° C. to 850° C. The epitaxial growth process may be non-selective as single crystal semiconductor material (e.g., single crystal silicon or SiGe) is epitaxially deposited onto any exposed crystalline surface such as the exposed top surface 10a. The thickness of the intrinsic base layer 16 may range from about 10 nm to about 600 nm. Layer thicknesses herein are evaluated in a direction normal to the top surface 10a of substrate 10.

A base dielectric layer 18 is formed on a top surface 16a of intrinsic base layer 16 and, in the representative embodiment, directly contacts the top surface 16a. The base dielectric layer 18, which reproduces the topography of the underlying intrinsic base layer 16, may be comprised of an electrical insulator with a dielectric constant (e.g., a permittivity) characteristic of a dielectric material. In one embodiment, the base dielectric layer 18 may be comprised of a high temperature oxide (HTO) deposited using rapid thermal process (RTP) at temperatures of 500° C. or higher. Alternatively, the base dielectric layer 18 may be comprised of oxide formed by a different deposition process, thermal oxidation of silicon (e.g., oxidation at high pressure with steam (HIPOX)), or a combination of these processes.

With reference to FIGS. 2, 2A, 2B, 2C in which like reference numerals refer to like features in FIG. 1 and at a subsequent fabrication stage of the processing method, a sacrificial layer 20 is deposited on the top surface 18a of the base dielectric layer 18. In a representative embodiment, the sacrificial layer 20 may be comprised of polysilicon deposited by CVD using either silane or disilane as a silicon source.

Trenches 22, 24 are formed that extend from a top surface 20a of the sacrificial layer 20 completely through the sacrificial layer 20, the base dielectric layer 18, the intrinsic base layer 16, and into the substrate 10. Trenches 26, 27, 28, 29, 30 are formed adjacent to trench 22 and trenches 31, 32, 33, 34, 35 are formed adjacent to trench 24. Trenches 26-35 extend from the top surface 20a of the sacrificial layer 20 completely through the sacrificial layer 20, the base dielectric layer 18, the intrinsic base layer 16, and into the substrate 10. Sections 58, 59, 60, 61 of the substrate 10 remain intact between respective adjacent pairs of the trenches 26-30 and sections 62, 63, 64, 65 of the substrate 10 remain between respective adjacent pairs of the trenches 31-35.

Trench 22 includes an exterior sidewall 36 and an interior sidewall 37 joined to the exterior sidewall 36 by a bottom surface 22a and sidewalls 38, 39. Trench 24 includes an interior sidewall 40 and an exterior sidewall 41 joined to the interior sidewall 40 by a bottom surface 24a and sidewalls 42, 43. Each of the trenches 26-30 includes an exterior sidewall 44, an interior sidewall 45, and a bottom surface 47 and sidewalls 48, 49 joining the exterior sidewall 44 with the interior sidewall 45. Each of the trenches 31-35 includes an exterior sidewall 50, an interior sidewall 51, and a bottom surface 52 and sidewalls 53, 54 joining the exterior sidewall 50 with the interior sidewall 51. The trenches 22, 24, 26-30, and 31-35 may each have a shallower depth relative to the top surface 10a than the depth of the trench isolation regions 12, 14 relative to the same reference plane.

Adjacent pairs of the trenches 26-30 and adjacent pairs of the trenches 31-35 are separated by a spacing, S, given by a feature pitch to define respective grating patterns fo segmented troughs. The pitch is given by a centerline-to-centerline distance between the adjacent pairs. The number and feature pitch of the trenches 26-30 and the number and feature pitch of trenches 31-35 are design parameters selected when the trenches 26-35 are formed in the substrate 10.

Trenches 26, 30, 31, and 35 may have a length, $L_1$, and trenches 27-29 and 32-34 may be characterized by a length, $L_2$, that is shorter than $L_1$. Trenches 22, 24 each have a length, $L_3$, that may be longer or shorter than one or both of the lengths $L_1$ or $L_2$. In each instance, these lengths represent the longest dimension of the trenches 22, 24, 26-30, and 31-35. A centerline of trench 22 along its length, $L_3$, is aligned transverse to respective centerlines of trenches 26-30 along their respective lengths $L_1$, $L_2$ and is orthogonal to the respective centerlines of trenches 26-30 in the representative embodiment. A centerline of trench 24 along its length, $L_3$, is aligned transverse to respective centerlines of trenches 31-35 along their respective lengths $L_1$, $L_2$ and is orthogonal to the respective centerlines of trenches 31-35 in the representative embodiment. Each of the lengths corresponds to the largest dimension of the respective trenches 22, 24, 27-29 and 32-34 in a plane normal to the top surface 10a.

In the representative embodiment, the respective interior sidewalls 45 of trenches 26 and 30 are coextensive with the exterior sidewall 36 of trench 22 and, thereby, define a continuous open volume. However, the respective interior sidewalls 45 of trenches 27-29 are not coextensive with the exterior sidewall 36 of trench 22 so that a portion 90 of the collector region 94 intervenes between these interior sidewalls 45 and the exterior sidewall 36. In each instance, these lengths represent the longest dimension of the trenches 22 and 26-30.

In the representative embodiment, the respective interior sidewalls 51 of trenches 31 and 35 are coextensive with the exterior sidewall 41 of trench 24 and, thereby, define a continuous open volume. However, the respective interior sidewalls 51 of trenches 32-34 are not coextensive with the exterior sidewall 41 of trench 24 so that a portion 92 of the collector region 94 intervenes between these interior sidewalls 51 and the exterior sidewall 41.

A portion 91 of the collector region 94 is disposed between the interior sidewall 37 of trench 22 and the interior sidewall 40 of trench 24. The portion 91 of the collector region 94 is larger than the portions 90, 92 and is preferably significantly larger than portions 90, 92.

The trenches 22, 24, 26-30, and 31-35 may be formed using photolithography and etching processes. To that end, a mask layer 56 may be applied on the top surface 20a of the sacrificial layer 20. The mask layer 56 may comprise a photoresist that is applied as a fluid by a spin coating process, pre-baked, exposed to a radiation projected through a photomask, baked after exposure, and developed with a chemical developer to form an etch mask that includes a pattern of openings coinciding with the intended locations of the trenches 22, 24, 26-30, and 31-35. The pattern of openings is transferred from the mask layer 56 to the sacrificial layer 20, the base dielectric layer 18, the intrinsic base layer 16, and the substrate 10 to define the trenches 22, 24, 26-30, and 31-35. The etching process may comprise a dry etching process, such as reactive-ion etching (RIE). The etching process, which may be conducted in a single etching step or multiple steps, relies on one or more etch chemistries that remove the materials of the mask layer 56, the sacrificial layer 20, the base dielectric layer 18, the intrinsic base layer 16, and the substrate 10, and may comprise a timed etch. The mask layer 56 is removed at the conclusion of the etching process. If comprised of a photoresist, the mask layer 56 may be removed by ashing or solvent stripping, followed by a conventional cleaning process.

Figure 3:
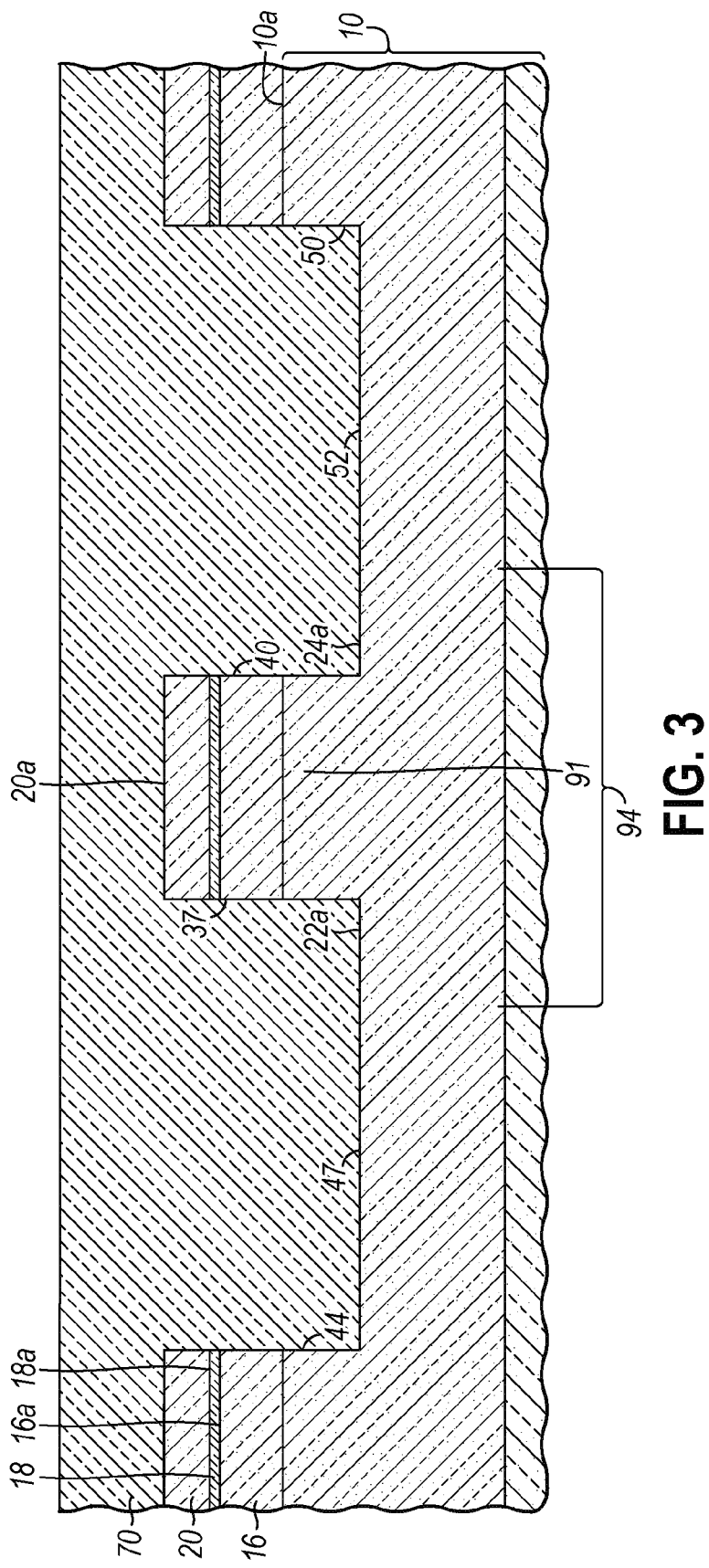
Figure 3A:
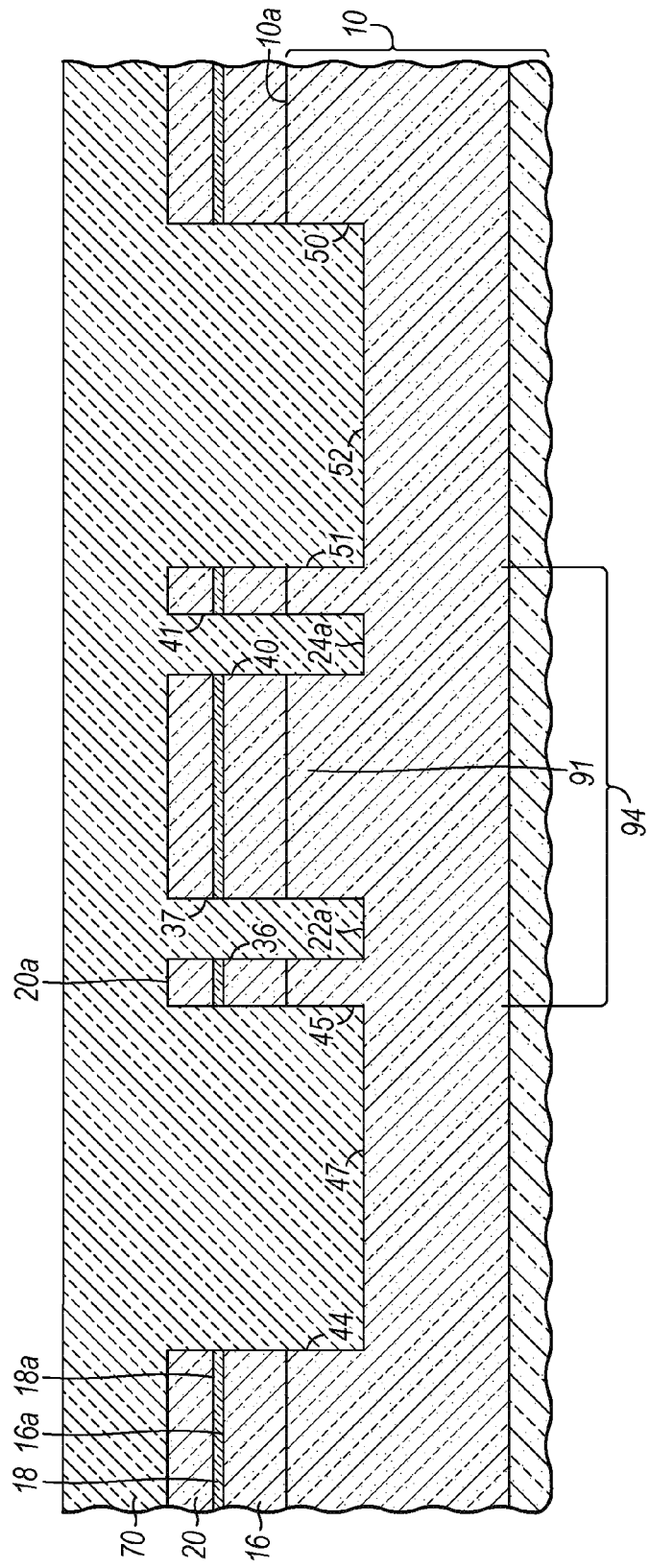
FIG. 3A is a cross-sectional view similar to FIG. 2A at the fabrication stage of FIG. 3.

With reference to FIGS. 3, 3A in which like reference numerals refer to like features in FIGS. 2, 2A-2C and at a subsequent fabrication stage of the processing method, a dielectric layer 70 comprised of an electrical insulator is formed that at least partially, and preferably completely, fills the trenches 22, 24, 26-30, and 31-35 with portions of the electrical insulator. The dielectric layer 70 also deposits on the top surface 20a of the sacrificial layer 20.

Dielectric layer 70 may comprise any suitable organic or inorganic dielectric material recognized by a person having ordinary skill in the art. The dielectric layer 70 may be comprised of an electrical insulator, which may be characterized by an electrical resistivity at room temperature of greater than $10^{10}(\Omega\text{-m})$. Candidate inorganic dielectric materials for dielectric layer 70 may include, but are not limited to, silicon dioxide ($SiO_2$), fluorine-doped silicon glass (FSG), and combinations of these dielectric materials. Alternatively, dielectric layer 70 may comprise a low-k dielectric material characterized by a relative permittivity or dielectric constant smaller than the $SiO_2$ dielectric constant of approximately 3.9. Candidate low-k dielectric materials for dielectric layer 70 include, but are not limited to, porous and nonporous spun-on organic low-k dielectrics, such as spin-on spun-on aromatic thermoset polymer resins like polyarylenes, porous and nonporous inorganic low-k dielectrics, such as organosilicate glasses, hydrogen-enriched silicon oxycarbide (Si-COH), and carbon-doped oxides, and combinations of these and other organic and inorganic dielectrics. Dielectric layer 70 may be deposited by any number of techniques including, but not limited to, sputtering, spin-on application, or CVD.

The dielectric material of dielectric layer 70 residing inside the trenches 22, 24, 26-30, and 31-35 may also include subsurface voids representing empty volumes devoid of solid matter. Such voids may have an effective dielectric constant of approximately unity (about 1.0) and may be filled by air at or near atmospheric pressure, be filled by another gas at or near atmospheric pressure, or contain air or gas below atmospheric pressure (e.g., a partial vacuum) in the completed microelectronic structure. The composite dielectric constant of the dielectric material may be lowered by the introduction of voids.

In one specific embodiment, the dielectric layer 70 may be comprised of an oxide of silicon (e.g., $SiO_2$) that may be deposited by low pressure chemical vapor phase deposition (LPCVD) using a silicon source of either silane or a mixture of silane with nitrogen. LPCVD is conducted at subatmospheric pressures, which tends to reduce unwanted gas-phase reactions and improve film thickness uniformity across the substrate 10. For example, the substrate temperature during LPCVD may range from 600° C. to 650° C. and the process chamber pressure during LPCVD may be constrained in a range between 25 Pa and 150 Pa.

Figure 4:
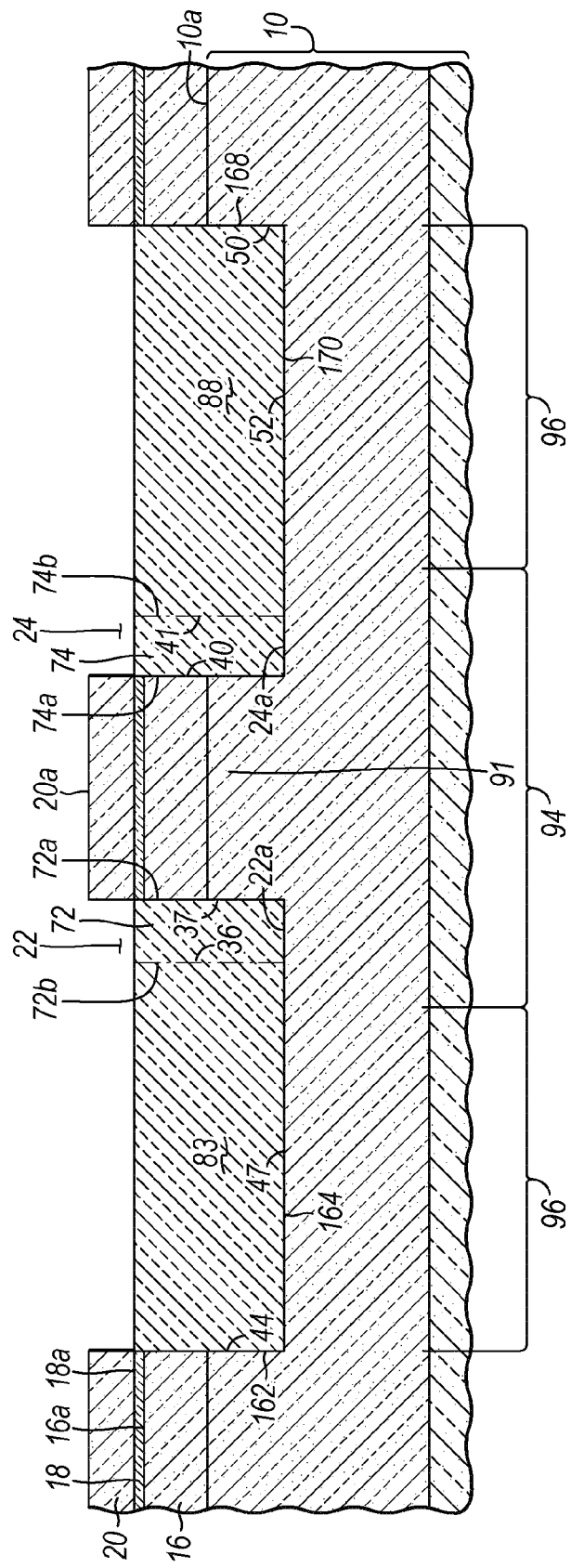
Figure 4A:
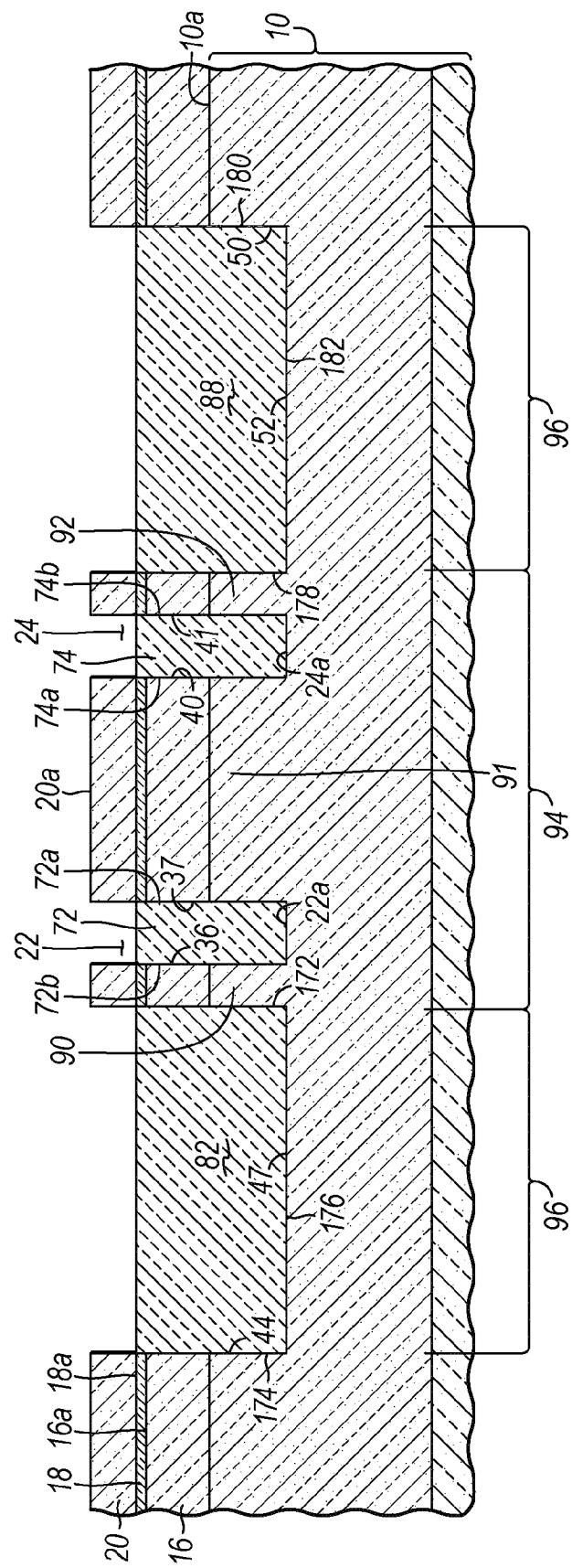
FIG. 4A is a cross-sectional view of the different portion of the substrate at the fabrication stage of FIG. 4.
Figure 4B:
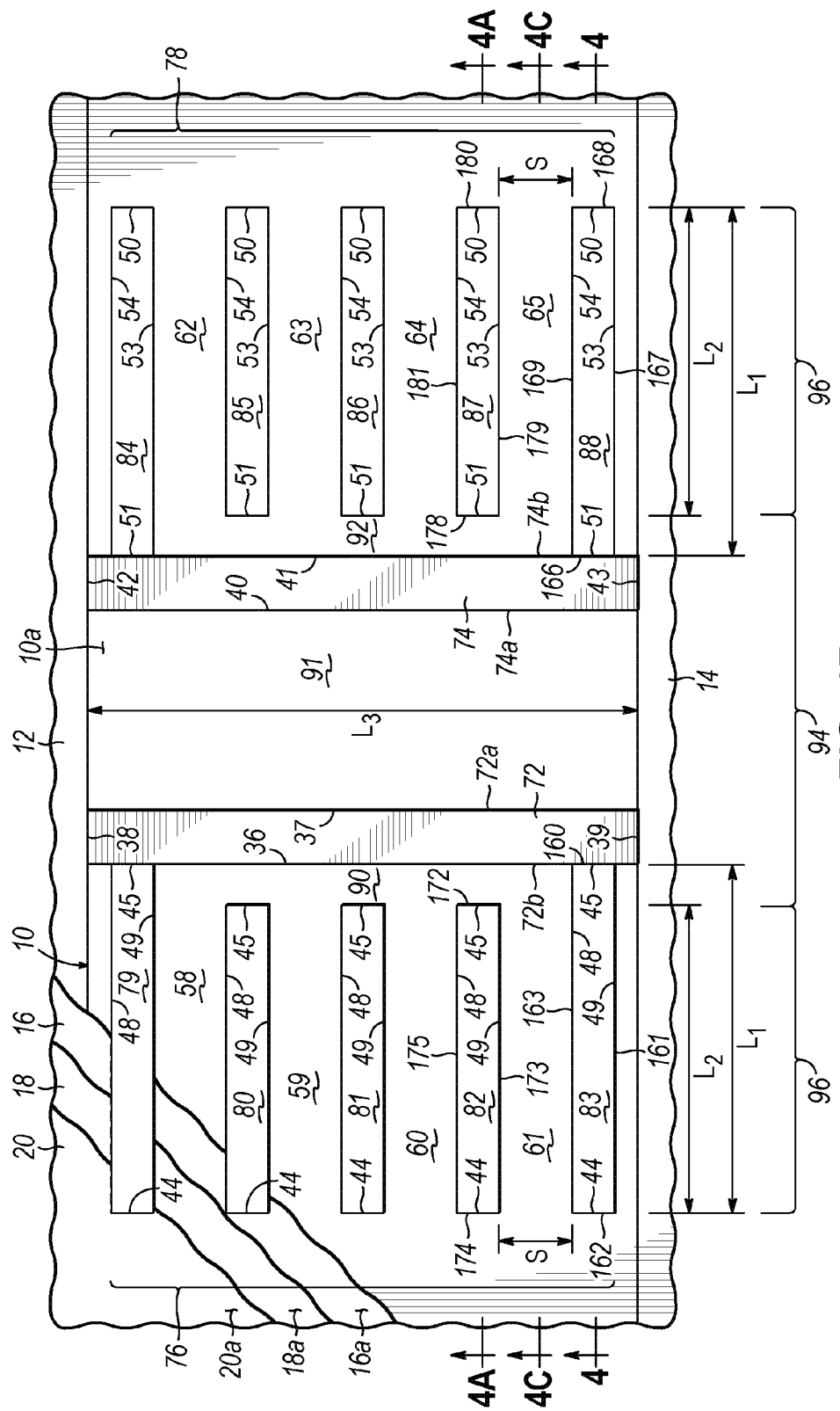
Figure 4C:
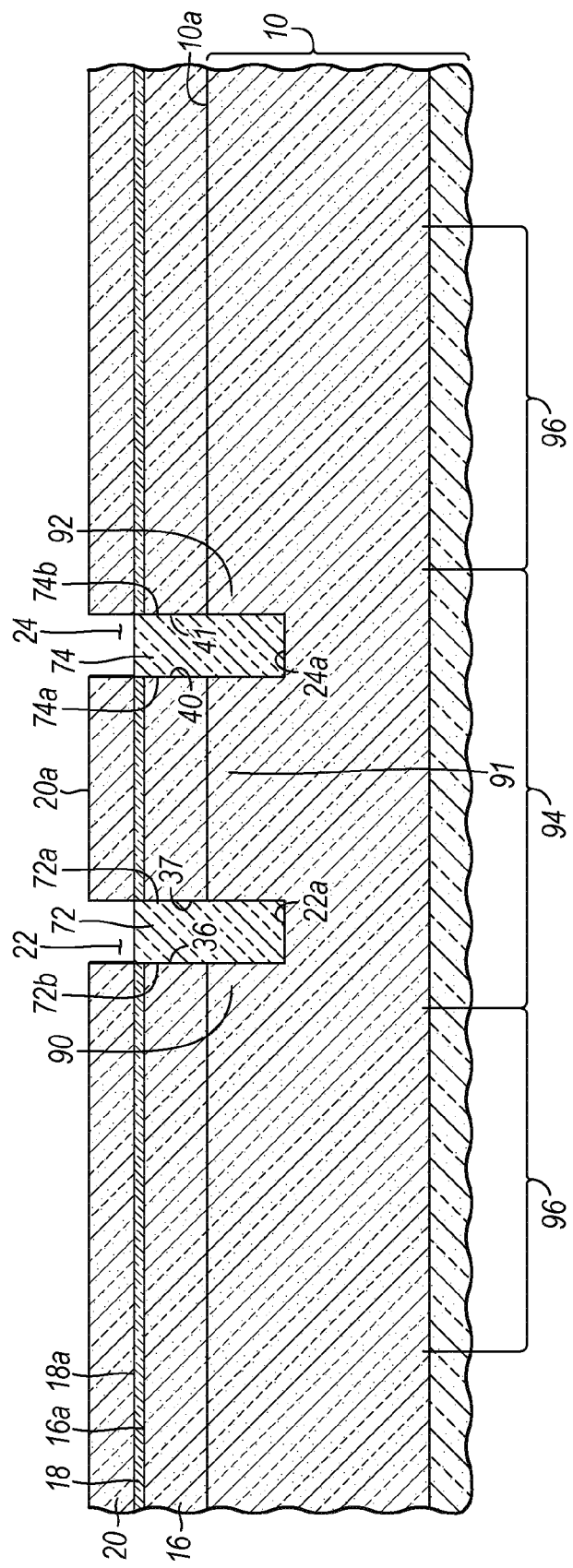
FIG. 4C is a cross-sectional view taken generally along line 4C-4C in FIG. 4B.

With reference to FIGS. 4, 4A, 4B in which like reference numerals refer to like features in FIGS. 3, 3A and at a subsequent fabrication stage of the processing method, the dielectric layer 70 is removed from the top surface 20a of the sacrificial layer 20 but not from within the trenches 22, 24, 26-30, and 31-35. The dielectric layer 70 may be removed from the top surface 20a by a wet etching process or a dry etching process, which may be end-pointed based upon exposure of the sacrificial layer 20 or may alternatively be timed. If the dielectric layer 70 is comprised of an oxide of silicon, then RIE may be employed to remove the dielectric layer 70 from the top surface 20a of sacrificial layer 20. Alternatively, an oxide etch, such as buffered hydrofluoric acid or diluted hydrofluoric acid, may be used to remove the dielectric layer

70. The top surface 20*a* of the sacrificial layer 20 is exposed after the overlying thickness of the dielectric layer 70 is removed.

The electrical insulator inside trenches 22, 24 defines isolation regions 72, 74, which may be recessed relative to the top surface 20*a* of the sacrificial layer 20 but are not removed by the etching process. The isolation regions 72, 74 extend through the intrinsic base layer 16 and into the substrate 10 to a depth relative to the top surface 10*a* that is shallower than the depth of the trench isolation regions 12, 14. Isolation region 72 has boundaries nominally coextensive with the boundaries of trench 22, and isolation region 74 has boundaries nominally coextensive with the boundaries of trench 24. Isolation regions 72, 74 have respective interior sidewalls 72*a*, 74*a* and respective exterior sidewalls 72*b*, 74*b*.

The isolation regions 72, 74 reproduce the geometrical shape of the respective trenches 22, 24. In one embodiment, the isolation regions 72, 74 may comprise strips of electrical insulator that are aligned parallel to each other, and the isolation regions 72, 74 do not define a closed geometrical shape. In an alternative embodiment, the isolation regions 72, 74 may join or may be joined by additional isolation regions so that the isolation regions 72, 74 form a closed geometrical shape. The isolation regions 72, 74 penetrate to a shallower depth relative to the top surface 10*a* of the substrate 10 than the trench isolation regions 12, 14. In the representative embodiment, each of the isolation regions 72, 74 has a length nominally equal to length $L_3$.

The electrical insulator inside trenches 26-30 defines a plurality of isolation structures 79, 80, 81, 82, 83 that collectively comprise an isolation region 76. The isolation structures 79-83 reproduce the geometrical shape of the trenches 26-30. In one embodiment, the isolation structures 79-83 may comprise strips of electrical insulator that are aligned parallel relative to each other and transverse to a strip of electrical insulator comprising isolation region 72.

Isolation structure 83, which reproduces the geometrical shape of the trench 30, includes sidewalls 160, 161, 162, 163 and a bottom wall 164. Sidewall 160 is coextensive with the exterior sidewall 72*b* of isolation region 72. Isolation structure 79 includes sidewalls and a base wall similar in geometry and arrangement to those of isolation structure 83. Similarly, isolation structure 88, which reproduces the geometrical shape of the trench 35, includes sidewalls 166, 167, 168, 169 and a bottom wall 170. Sidewall 166 is coextensive with the exterior sidewall 74*b* of isolation region 74. Isolation structure 84 includes sidewalls and a bottom wall similar in geometry and arrangement to those of isolation structure 88. In the representative embodiment, each of the isolation structures 79, 83, 84, 88 has a length nominally equal to length $L_1$.

The electrical insulator inside trenches 31-35 defines a plurality of isolation structures 84, 85, 86, 87, 88 that collectively comprise an isolation region 78. The isolation structures 84-88 reproduce the geometrical shape of the trenches 31-35. In one embodiment, the isolation structures 84-88 may comprise strips of electrical insulator that are aligned parallel relative to each other and transverse to a strip of electrical insulator comprising isolation region 74.

Isolation structure 82, which reproduces the geometrical shape of the trench 29, includes sidewalls 172, 173, 174, 175 and a bottom wall 176. Sidewall 172 is spaced apart from the exterior sidewall 72*b* of isolation region 72 by a portion 90 of the collector region 94. Isolation structures 80, 81 include sidewalls and a bottom wall similar in geometry and arrangement to those of isolation structure 82. The portion 90 of the collector region 94 extends laterally from isolation structure 79 to isolation structure 83 and, in the transverse direction, extends from the isolation structures 80-82 to the exterior sidewall 72*b* of isolation region 72. In the representative embodiment, each of the isolation structures 80-82 has a length nominally equal to length $L_2$ and, therefore, may be shorter in length than isolation structures 79, 83.

Similarly, isolation structure 87, which reproduces the geometrical shape of the trench 34, includes sidewalls 178, 179, 180, 181 and a bottom wall 182. Sidewall 178 is spaced apart from the exterior sidewall 74*b* of isolation region 74 by a portion 92 of the collector region 94. Isolation structures 85, 86 include sidewalls and a base wall similar in geometry and arrangement to those of isolation structure 87. The portion 92 of the collector region 94 extends laterally from isolation structure 84 to isolation structure 88 and, in the transverse direction, extends from the isolation structures 85-87 to the exterior sidewall 74*b* of isolation region 74. In the representative embodiment, each of the isolation structures 85-87 has a length nominally equal to length $L_2$ and, therefore, may be shorter in length than isolation structures 84, 88.

The collector region 94 is peripherally disposed between the interior sidewalls 172 of the isolation structures 80-82 and the interior sidewalls 178 of the isolation structures 85-87. The portion 91 of the collector region 94 is located between an interior sidewall 72*a* of isolation region 72 and an interior sidewall 74*a* of isolation region 74. Only the portions 90, 92 of collector region 94, which are comparatively smaller than the portion 91 of the collector region 94, reside peripherally outside of the isolation regions 72, 74. The isolation structures 79-83 and the isolation structures 84-88 are segmented with additional intervening portions 58-61 and 62-65, respectively, of the semiconductor material of the collector region 94 separating adjacent pairs of the isolation structures 79-88.

A subcollector region 96 is defined as a portion of the substrate 10 that is beneath the isolation regions 76, 78 and that emerges at the top surface 10*a* of substrate 10 peripherally outside of the isolation regions 76, 78 to permit establishment of electrical contact. The collector region 94 and subcollector region 96 are each doped with the electrically-active dopant from the initial ion implantations (FIG. 1) so that the collector region 94 and subcollector region 96 have the same conductivity type. The isolation regions 72, 74 are disposed peripherally between the isolation regions 76, 78 such that the isolation regions 72, 74 are positioned within the collector region 94.

Figure 5:
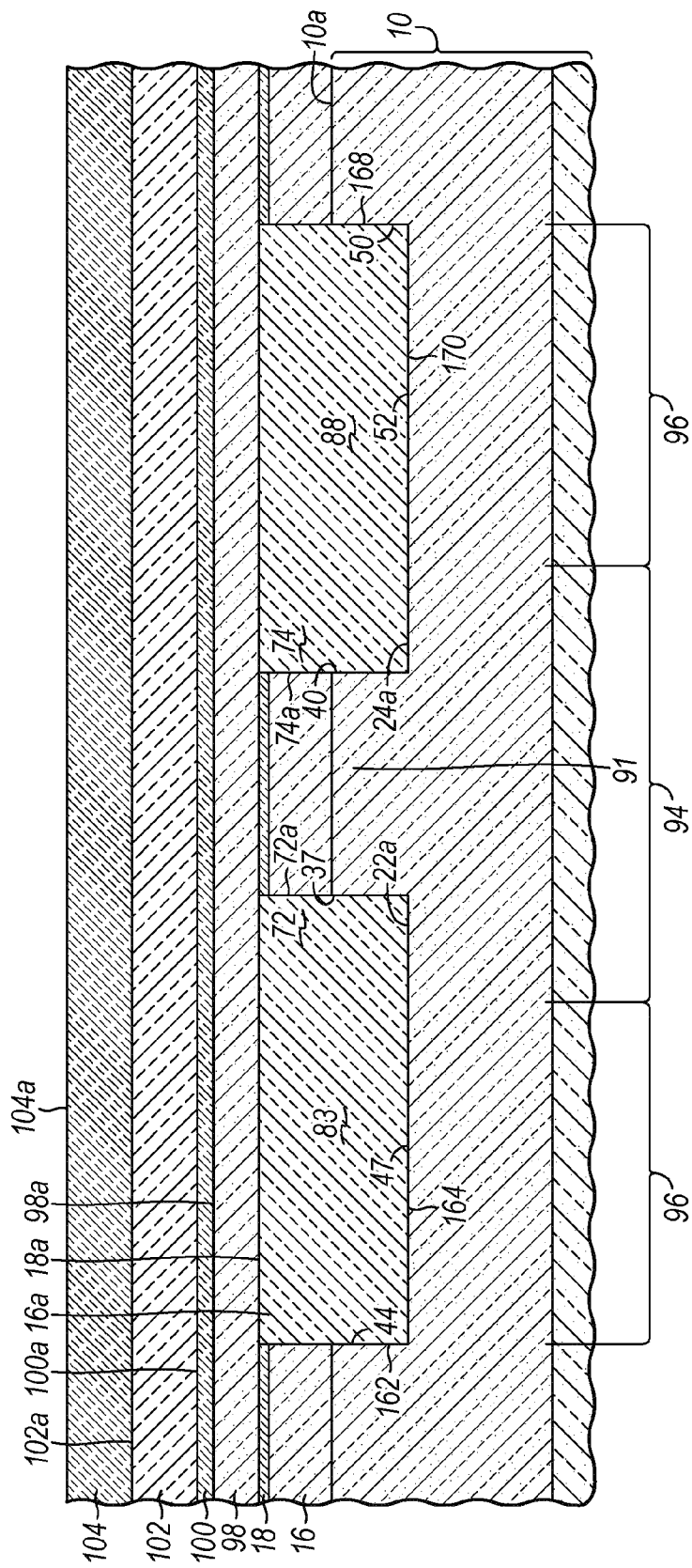

With reference to FIG. 5 in which like reference numerals refer to like features in FIGS. 4, 4A-4D and at a subsequent fabrication stage of the processing method, the sacrificial layer 20 is partially or completely removed to reduce the height difference between either the top surface 20*a* of the sacrificial layer 20 or, if the sacrificial layer 20 is completely removed, the top surface 18*a* of the base dielectric layer 18 and the top surfaces of the isolation regions 72, 74, 76, 78. The sacrificial layer 20 may be at least partially removed by a wet etching process or a dry etching process. In particular, if the sacrificial layer 20 is comprised of polysilicon, the sacrificial layer 20 may be partially or completely removed by an etching process, such as a dry etch process or a wet etch process (e.g., an aqueous mixture of nitric acid ($HNO_3$) and hydrofluoric acid (HF)). The base dielectric layer 18 may operate as an etch stop for the removal of the sacrificial layer 20 if the materials comprising the sacrificial layer 20 and base dielectric layer 18 are selected such that the sacrificial layer 20 can be selectively etched relative to base dielectric layer 18.

An extrinsic base layer 98 is formed on the top surface 18*a* of the base dielectric layer 18. In one embodiment, the extrinsic base layer 98 may be comprised of polycrystalline semiconductor material (e.g., polysilicon or polycrystalline SiGe)

deposited by CVD process. If the extrinsic base layer 98 is comprised of SiGe, the concentration of Ge may have a graded or an abrupt profile and may include additional layers, such as a Si cap. The extrinsic base layer 98 may be in situ doped with a concentration of a dopant, such as an impurity species from Group III of the Periodic Table (e.g., boron) effective to impart p-type conductivity. As a consequence of the deposition process and the non-crystalline nature of base dielectric layer 18 on which extrinsic base layer 98 is formed, the entire extrinsic base layer 98 is comprised of polycrystalline semiconductor material. If the sacrificial layer 20 is only partially removed before the extrinsic base layer 98 is deposited and is comprised of, for example, polysilicon, then the remaining thickness of the sacrificial layer 20 is subsumed into the extrinsic base layer 98. The extrinsic base layer 98 also covers the top surfaces of the isolation regions 72, 74, 76, 78.

A stack of dielectric layers 100, 102, 104 is then formed on the extrinsic base layer 98. Dielectric layer 100, which is formed on a top surface 98a of extrinsic base layer 98, may directly contact the top surface 98a. Dielectric layer 102, which is formed on a top surface 100a of dielectric layer 100, may directly contact the top surface 100a. Dielectric layer 104, which is formed on a top surface 102a of dielectric layer 102, may directly contact the top surface 102a. Dielectric layer 100 and dielectric layer 104 may be comprised of the same electrical insulator, such as $SiO_2$ deposited by CVD. Dielectric layer 102 may be comprised of an electrical insulator with a different etch selectivity than dielectric layers 100, 104. If the dielectric layers 100, 104 are comprised of $SiO_2$, then dielectric layer 102 may be comprised of silicon nitride ($Si_3N_4$) deposited using CVD.

Figure 6:
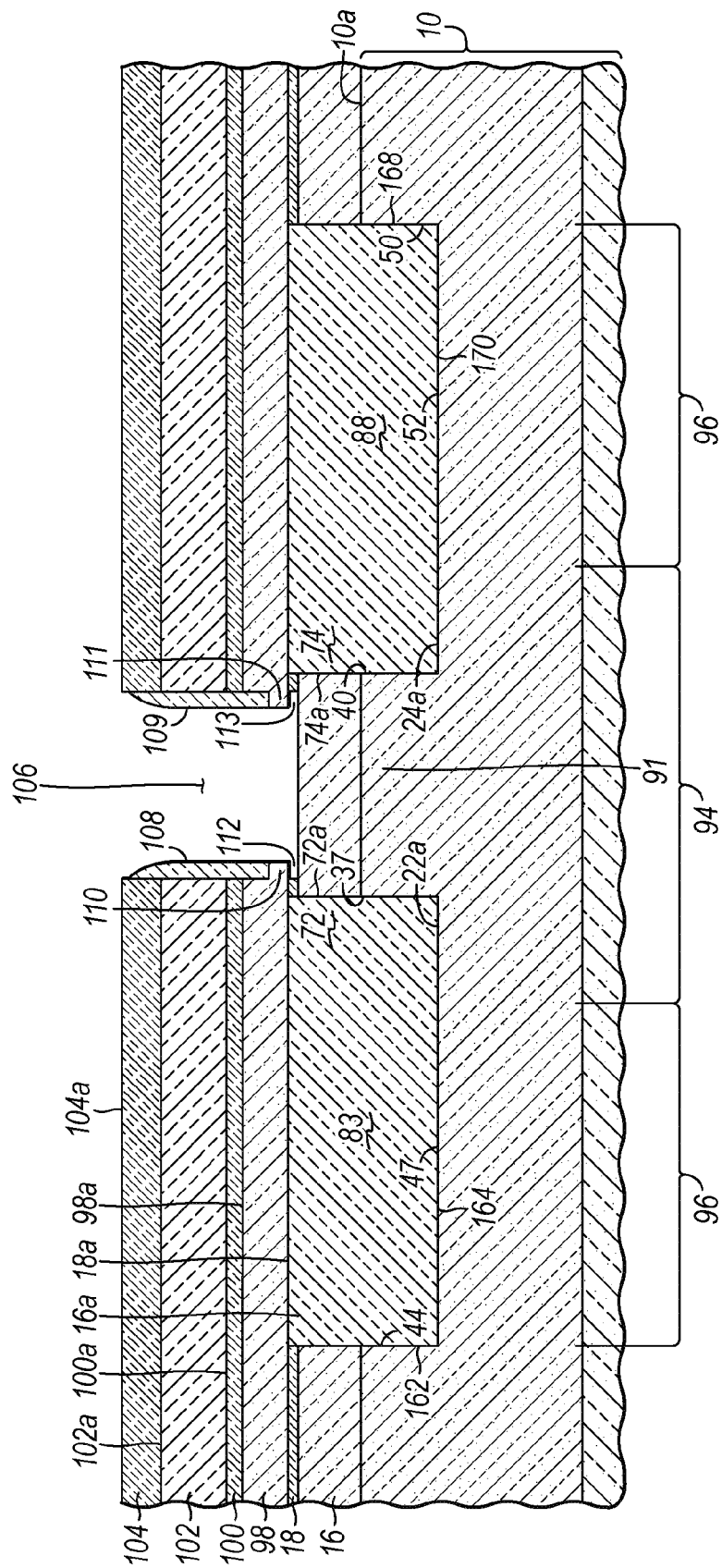

With reference to FIG. 6 in which like reference numerals refer to like features in FIG. 5 and at a subsequent fabrication stage of the processing method, dielectric layers 100, 102, 104 are patterned using photolithography and etching processes to define an emitter opening 106 aligned with the intrinsic base layer 16 overlying the collector region 94. To that end, a patterned etch mask (not shown) is applied to the dielectric layer 104. In one embodiment, the etch mask may be a photoresist layer comprised of a sacrificial organic material applied by spin coating to the top surface 104a of dielectric layer 104. The photolithography process that patterns the photoresist layer exposes the photoresist to radiation imaged through a photomask and develops the resulting latent feature pattern in the exposed photoresist to define a window at the intended location for the emitter opening 106. The etching process, which may be RIE, forms the emitter opening 106 in the dielectric layers 100, 102, 104 by sequentially removing regions of each of the dielectric layers 100, 102, 104 unprotected by the etch mask. The etching process, which may be conducted in a single etching step or multiple steps, relies on one or more etch chemistries that remove the individual dielectric layers 100, 102, 104 and may comprise one or more discrete timed or end-pointed etches.

The emitter opening 106 is extended by an etching process, such as RIE, into the extrinsic base layer 98. The etching process is controlled such that the emitter opening 106 is only partially extended through the thickness of the extrinsic base layer 98. Specifically, a thickness of the extrinsic base layer 98 is partially removed by the etching process across the surface area of the top surface 98a that is exposed inside the emitter opening 106 in dielectric layers 100, 102, 104. After etching, the top surface 98a of extrinsic base layer 98 overlying the collector region 94 is recessed (i.e., in a different plane) relative to a plane containing the top surface 98a of the extrinsic base layer 98 in masked regions. The extrinsic base layer 98 overlying the collector region 94 is thinner than the extrinsic base layer 98 outside of the emitter opening 106, which gives rise to a thickness difference. The etching process may be controlled such that the emitter opening 106 extends approximately half-way through the layer thickness of the extrinsic base layer 98. Following the conclusion of the etching process, the etch mask is removed. If comprised of photoresist, the etch mask may be removed by oxygen plasma ashing or chemical stripping.

Spacers 108, 109 are formed on the vertical sidewalls of the layers 98, 100, 102, 104 bounding the emitter opening 106. The spacers 108, 109, which extend vertically to the base of the emitter opening 106, may directly contact the recessed top surface 98a of extrinsic base layer 98. The spacers 108, 109 may be formed by depositing a conformal layer comprised of an electrical insulator and shaping the conformal layer with an anisotropic etching process, such as a RIE process, that preferentially removes the electrical insulator from horizontal surfaces. At the conclusion of the anisotropic etching process, the spacers 108, 109 constitute residual electrical insulator residing on the vertical surfaces represented by the coplanar sidewalls of the layers 98, 100, 102, 104. The spacers 108, 109 may be comprised of a dielectric material that is an electrical insulator, such as $Si_3N_4$ deposited by CVD in which instance the spacers 108, 109 are composed of the same dielectric material as dielectric layer 102.

With reference to FIG. 6 in which like reference numerals refer to like features in FIG. 5 and at a subsequent fabrication stage of the processing method, the emitter opening 106, as narrowed by the presence of the spacers 108, 109, is extended in depth completely through the extrinsic base layer 98 over an area aligned with the emitter opening 106. The extension of the emitter opening 106 may be provided by an anisotropic etching process, such as a RIE process. The etching process removes the material of extrinsic base layer 98 selectively (e.g., at a higher etch rate) to the materials comprising spacers 108, 109 and base dielectric layer 18, and stops on the base dielectric layer 18. Adjacent to the emitter opening 106 and beneath the spacers 108, 109, sections 110, 111 of extrinsic base layer 98 remain at the conclusion of the etching process. The sidewall of section 110 is vertically aligned with the adjacent portion of the sidewall of the spacer 108 bordering the emitter opening 106. The sidewall of section 111 is vertically aligned with the adjacent portion of the sidewall of the spacer 109 bordering the emitter opening 106.

The emitter opening 106 is extended in depth through the base dielectric layer 18 by an isotropic etching process, such as a wet chemical etching process. The etching process stops on the intrinsic base layer 16. The removal of this region of base dielectric layer 18 exposes the top surface 16a of intrinsic base layer 16 aligned with the emitter opening 106. The isotropic etching process removes the material of base dielectric layer 18 selectively to the materials comprising the spacers 108, 109, the extrinsic base layer 98, and the intrinsic base layer 16. If the base dielectric layer 18 is comprised of $SiO_2$, the wet chemical etching process may use either dilute hydrofluoric (DHF) or buffered hydrofluoric (BHF) as an etchant. If dielectric layer 104 is comprised of $SiO_2$ and contingent upon the etching conditions, the isotropic etching process may reduce the thickness of dielectric layer 104, as shown in the representative embodiment, or may completely remove dielectric layer 104 from dielectric layer 102.

Cavities 112, 113 are formed between the sections 110, 111 of extrinsic base layer 98 and the intrinsic base layer 16 when the base dielectric layer 18 is etched. Specifically, the isotropic etching process causes the base dielectric layer 18 to recede laterally beneath the sections 110, 111 of extrinsic base layer 98 and, more specifically, sidewalls of the base dielectric layer 18 are respectively caused to laterally recede relative to the respective sidewall of the sections 110, 111. In the representative embodiment, the sidewalls of the base dielectric layer 18 are each respectively recessed by a distance, d, relative to the sidewalls of sections 110, 111. The etch bias may be controlled during etching to regulate the lateral recession of the base dielectric layer 18 and, hence, the location of the sidewalls of the base dielectric layer 18 and depth of the cavities 112, 113. The sections 110, 111 of extrinsic base layer 98 are undercut by the cavities 112, 113 and the cavities 112, 113 define open spaces between the intrinsic base layer 16 and the extrinsic base layer 98.

Because the top surface 98a of extrinsic base layer 98 is recessed before the spacers 108, 109 are formed, the sections 110, 111 of extrinsic base layer 98 are thinner than the remainder of extrinsic base layer 98 outside of the vicinity of the emitter opening 106. For example, the sections 110, 111 may be one half of the thickness of the remainder of extrinsic base layer 98, which is nominally equal to the original deposited thickness. The sections 110, 111 of extrinsic base layer 98 may extend about the perimeter of the emitter opening 106 and may be connected together to form a continuous structure.

Figure 7:
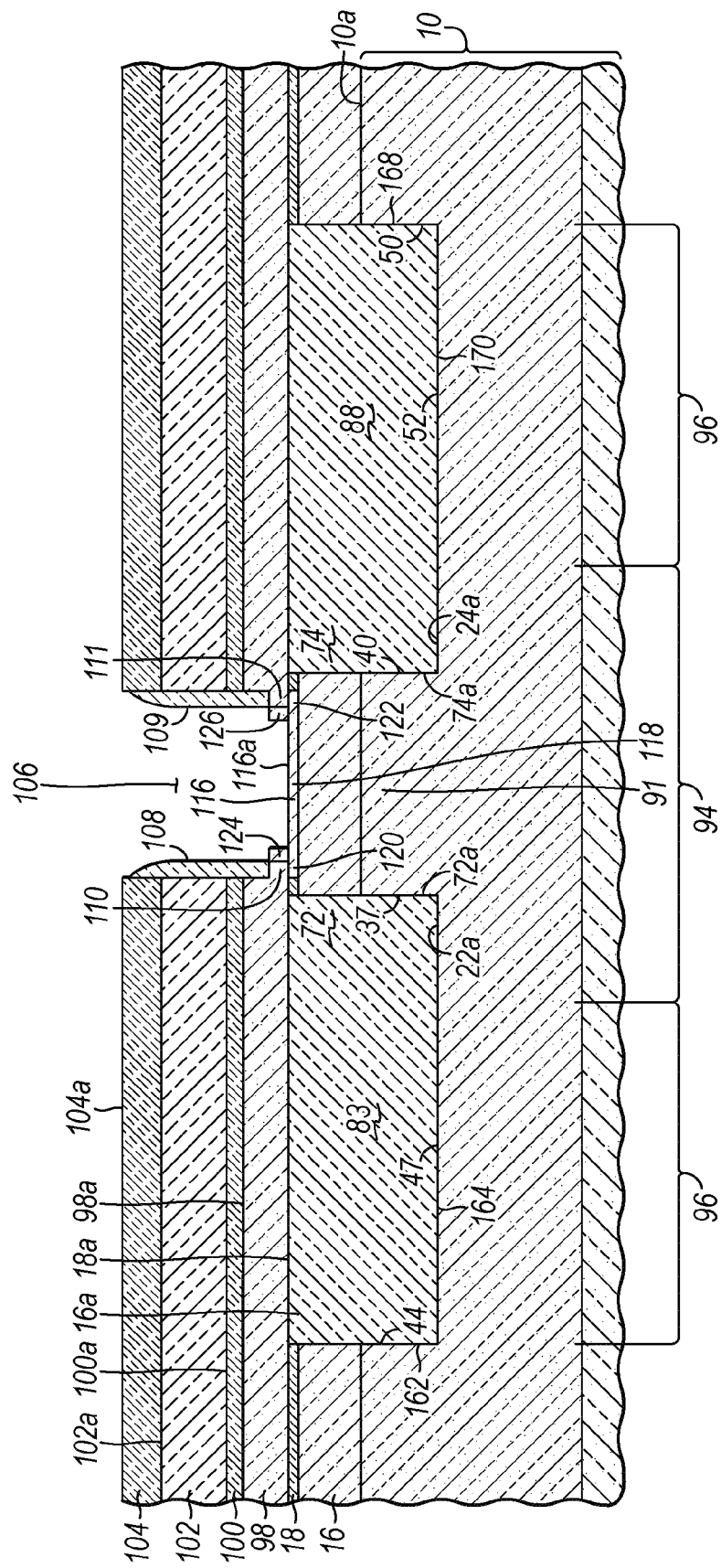

With reference to FIG. 7 in which like reference numerals refer to like features in FIG. 6 and at a subsequent fabrication stage of the processing method, a semiconductor layer 116 is formed as an additive layer on the top surface 16a of the intrinsic base layer 16 and, in the representative embodiment, is directly formed on the top surface 16a. The semiconductor layer 116 is comprised of semiconductor material deposited by an epitaxy method. The semiconductor material comprising the semiconductor layer 116 may be doped during or following deposition, or may be alternatively undoped. The semiconductor layer 116 may have a different composition than either the intrinsic base layer 16 or the extrinsic base layer 98.

During the deposition process, the semiconductor material of semiconductor layer 116 nucleates on the semiconductor material of the intrinsic base layer 16 and acquires the crystalline state (e.g., single crystal) of the intrinsic base layer 16 during growth. The deposition conditions are tailored so that there is no deposition on the spacers 108, 109 and dielectric layer 104 (or dielectric layer 102 if dielectric layer 104 has been previously removed). The thickness of the semiconductor layer 116 measured in a direction normal to its top surface 116a may be in the range for approximately 4 to 30 nm.

The semiconductor layer 116 includes a central section 118 flanked by peripheral sections 120, 122. Peripheral sections 120, 122, which are disposed along the outer perimeter or edges of semiconductor layer 116, respectively occupy the cavities 112, 113 and define a link electrically and physically coupling the intrinsic base layer 16 and the extrinsic base layer 98. The peripheral sections 120, 122 extend laterally from the respective sidewalls of the base dielectric layer 18 toward a centerline of the emitter opening 106. The peripheral sections 120, 122 of the semiconductor layer 116 and the extrinsic base layer 98 are in direct physical and electrical contact with each other, as are the peripheral sections 120, 122 and the top surface 16a of the intrinsic base layer 16. Specifically, the peripheral sections 120, 122 provide a direct connection for current flow between the extrinsic base layer 98 and the intrinsic base layer 16. The peripheral sections 120, 122 and the base dielectric layer 18 may have approximately equal layer thicknesses and, preferably, have equivalent layer thicknesses because the cavities 112, 113 are formed by the lateral recession of base dielectric layer 18 and then respectively filled by the peripheral sections 120, 122. The central section 118 of the semiconductor layer 116, which is located outside of the cavities 112, 113, is disposed between the unfilled space of the emitter opening 106 and the intrinsic base layer 16.

The semiconductor material constituting semiconductor layer 116 also grows on the material of the sections 110, 111 of extrinsic base layer 98 and grows laterally inward as additive regions 124, 126 of polycrystalline material into the emitter opening 106. The deposition process is controlled such that the additive regions 124, 126 project a short distance into the emitter opening 106 so that the emitter opening 106 is not significantly pinched off.

Figure 8:
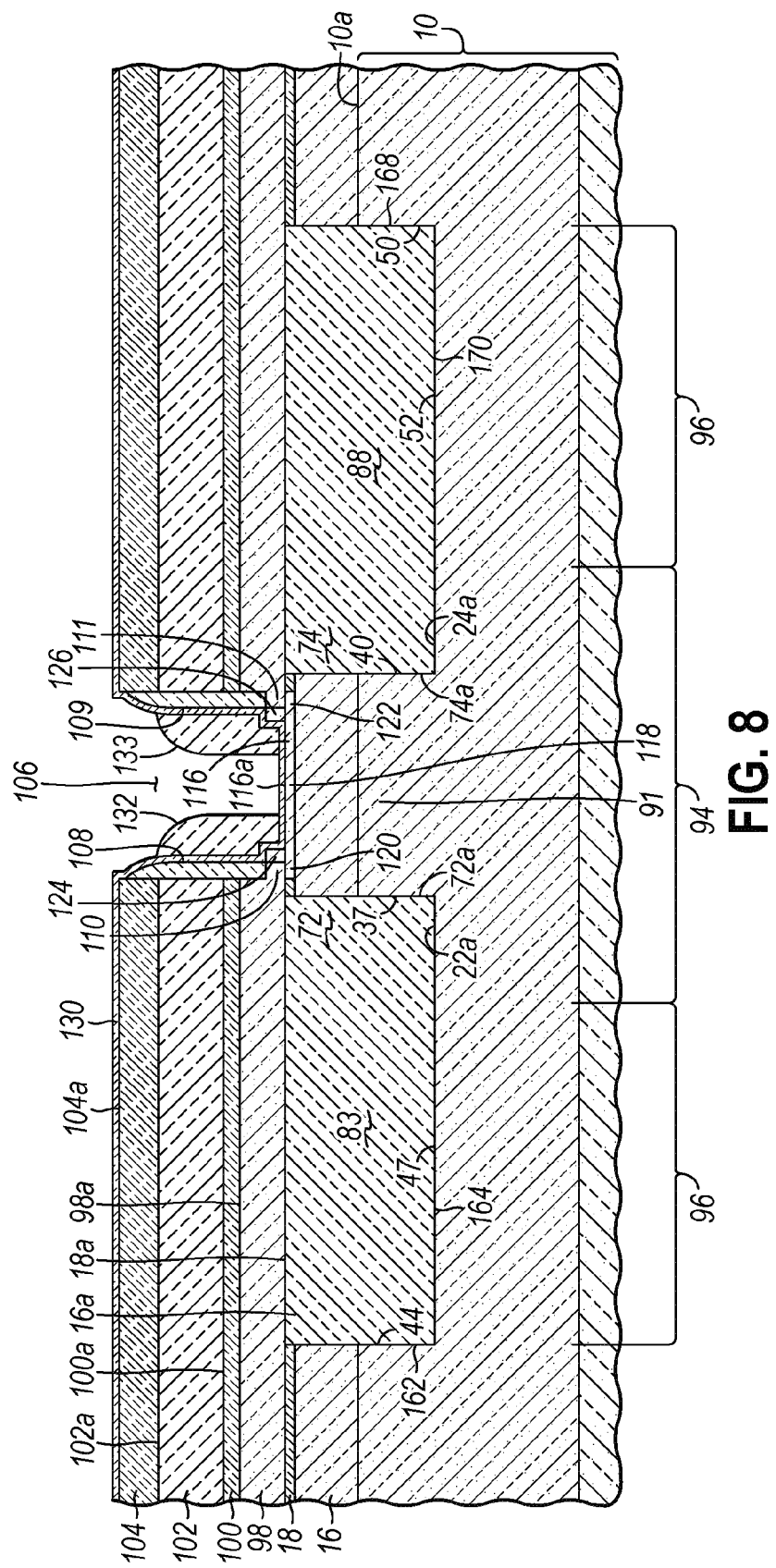

With reference to FIG. 8 in which like reference numerals refer to like features in FIG. 7 and at a subsequent fabrication stage of the processing method, a conformal layer 130 comprised of a dielectric material is deposited and spacers 132, 133 are formed on the spacers 108, 109 with conformal layer 130 as an intervening structure. The conformal layer 130 may be formed from a dielectric material that is electrically insulating, such as a thin layer of $SiO_2$ which may comprise a high temperature oxide (HTO) deposited by rapid thermal process (RTP) at temperatures of 500° C. or higher. Alternatively, the conformal layer 130 may be deposited by a different deposition process. Spacers 132, 133 are comprised of a dielectric material that is electrically insulating and etches selectively to the dielectric material comprising the conformal layer 130. For example, the spacers 132, 133 may be comprised of an electrical insulator, such as $Si_3N_4$, formed by deposition and anisotropic etching in a manner similar to spacers 108, 109. A portion of the conformal layer 130 covers the top surface 116a of the semiconductor layer 116 inside the emitter opening 106.

Figure 9:
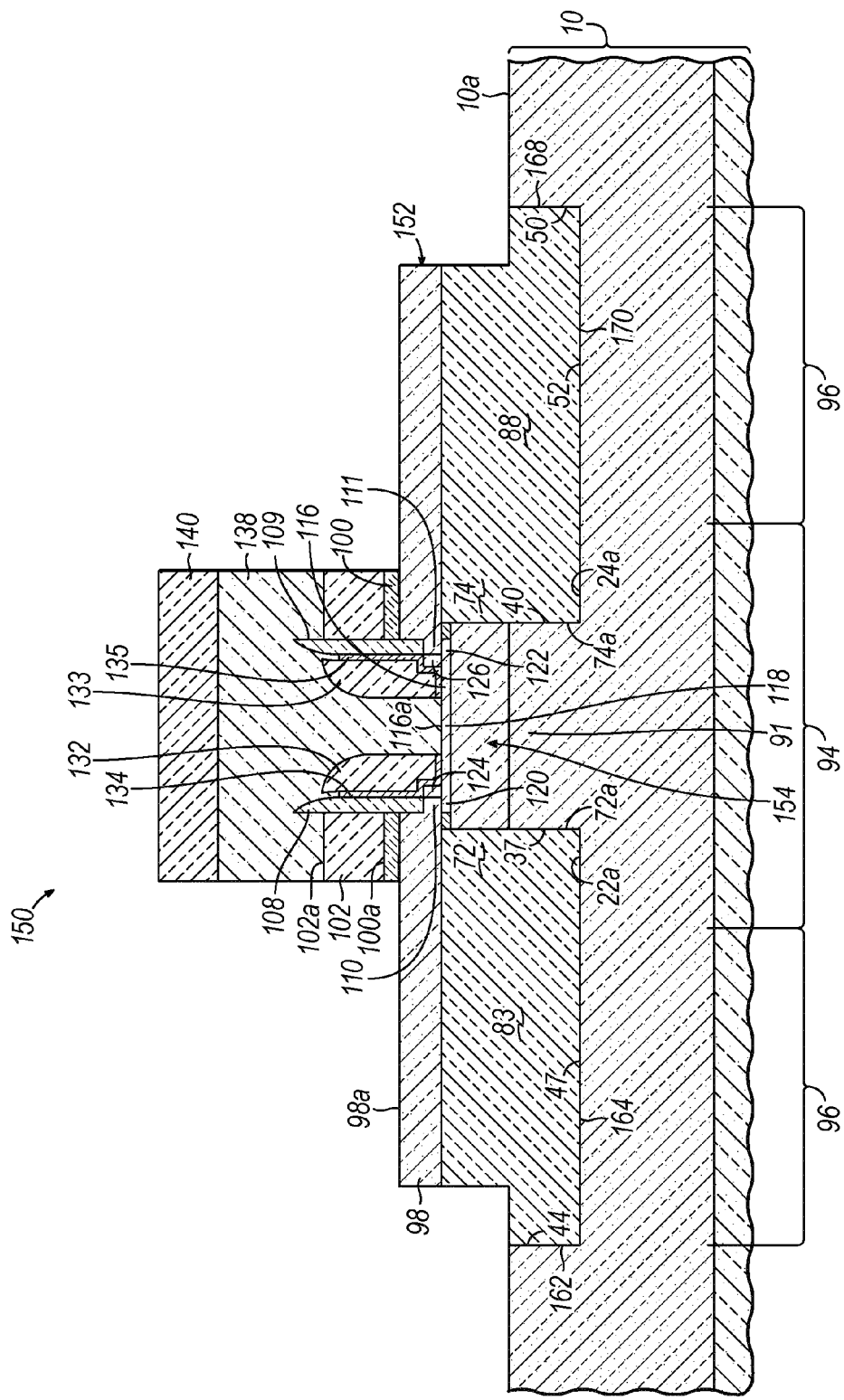
Figure 9A:
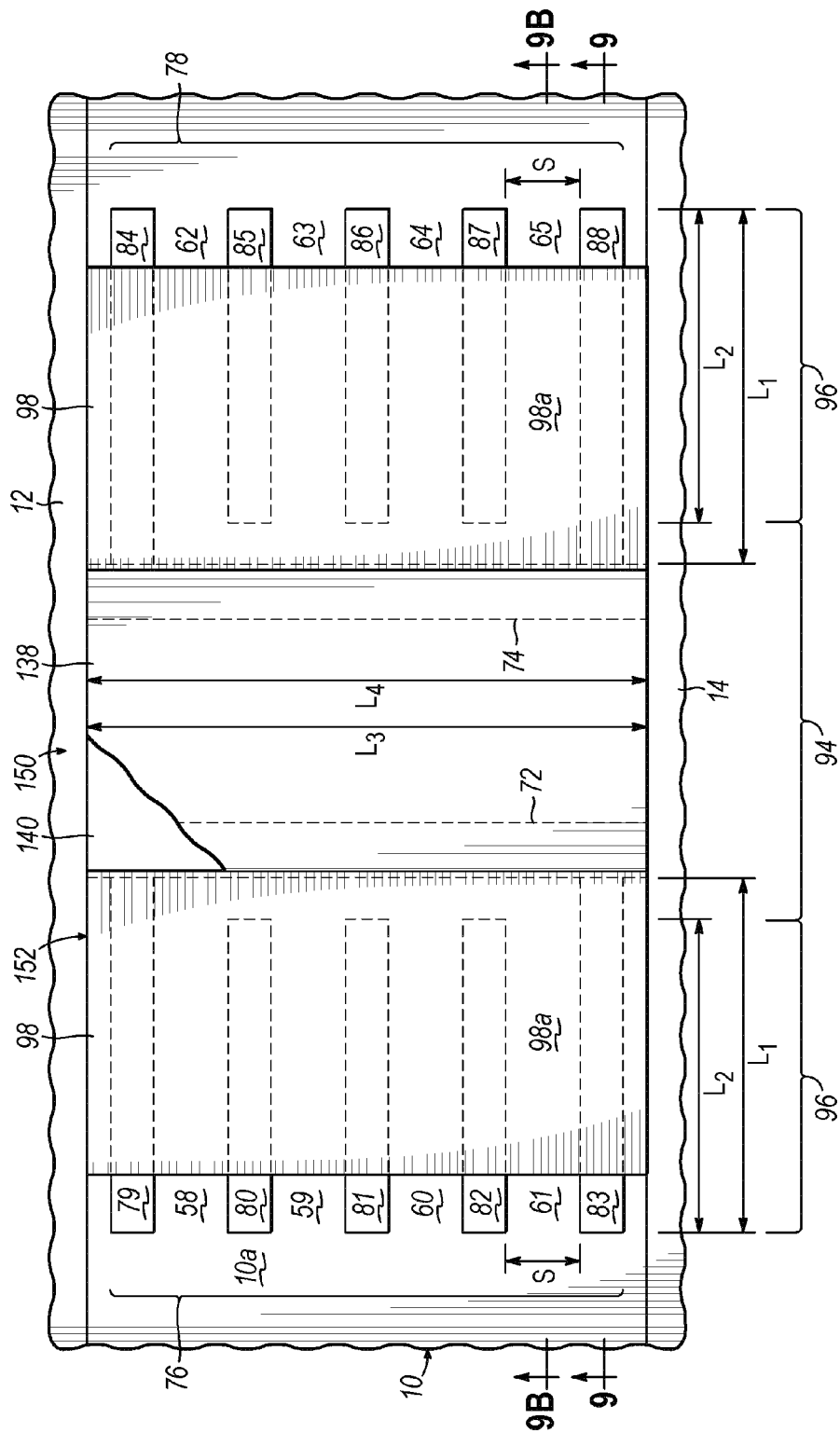
FIG. 9A is a top view of the substrate at the fabrication stage of FIG. 9.
Figure 9B:
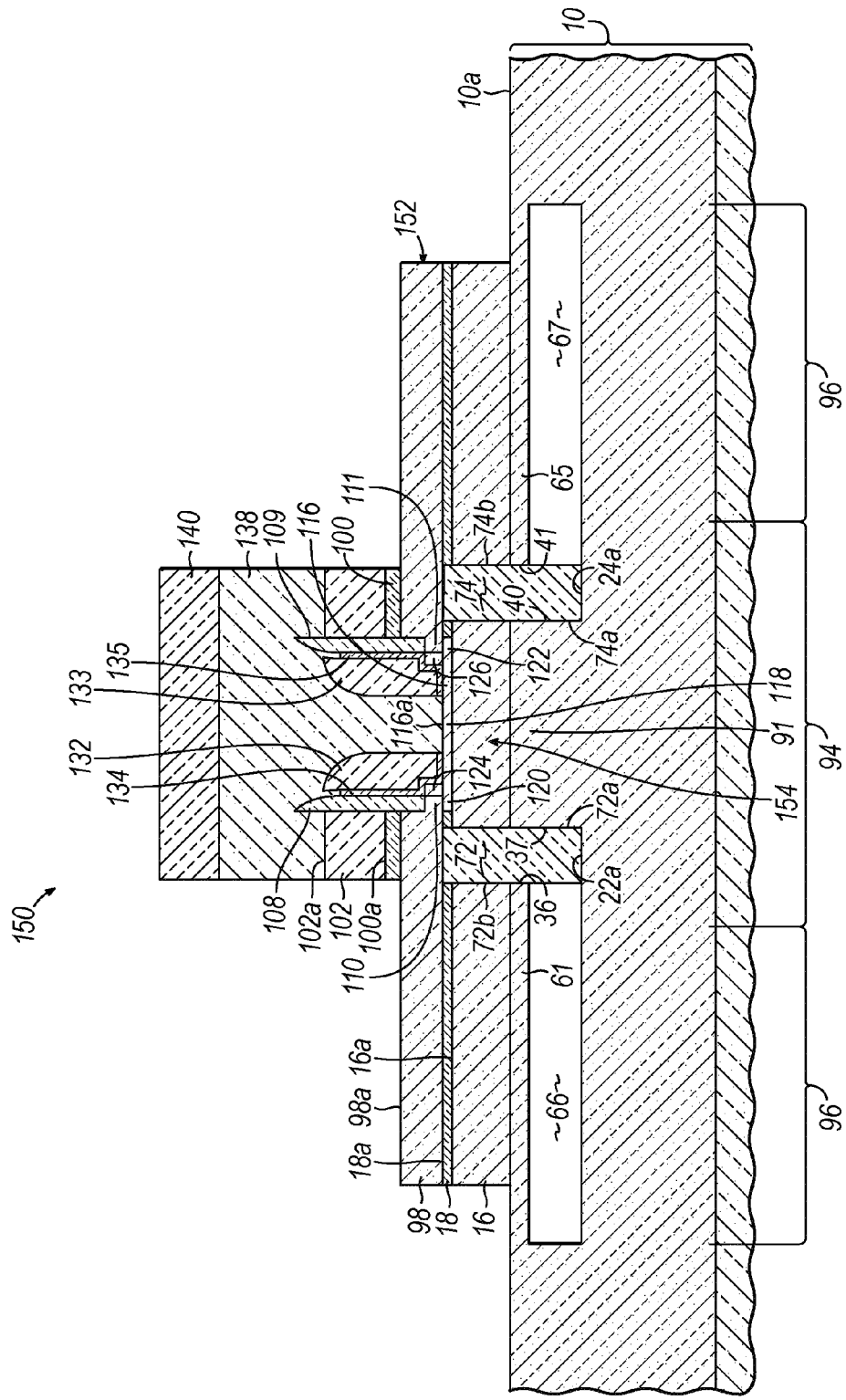
FIG. 9B is a cross-sectional view taken generally along line 9B-9B in FIG. 9A.

With reference to FIGS. 9, 9A, and 9B in which like reference numerals refer to like features in FIG. 8 and at a subsequent fabrication stage of the processing method, a top surface 116a of the semiconductor layer 116 is exposed by an etching process that removes the material of the conformal layer 130 inside the emitter opening 106 and laterally between the spacers 132, 133. The etching process stops on the material constituting semiconductor layer 116. The etching process may be chemical oxide removal (COR) that removes the material of conformal layer 130, if comprised of $SiO_2$, with minimal undercut beneath the spacers 132, 134. A COR process may utilize a mixture flow of hydrogen fluoride (HF) and ammonia ($NH_3$) in a ratio of 1:10 to 10:1 and may be performed at reduced pressures (e.g., about 1 mTorr to about 100 mTorr) and at approximately room temperature.

Portions of conformal layer 130 residing on dielectric layer 104 and the remnant of dielectric layer 104 are also removed by the etching process to reveal the top surface 102a of dielectric layer 102. An optional HF chemical cleaning procedure may follow the etching process. Spacers 134, 135 are formed from portions of the conformal layer 130 shielded during the performance of the etching process by the spacers 132, 133 and are respectively disposed between the spacers 108, 109 and the spacers 132, 133.

An emitter 138 of a bipolar junction transistor 150 is formed in the emitter opening 106. The non-conductive spacers 108, 109 and 132-135 encircle or surround the emitter 138 for electrically isolating the emitter 138 from the extrinsic base layer 98. The emitter 138 indirectly contacts the intrinsic base layer 16 because of the intervening semiconductor layer 116. A dielectric cap 140 may be optionally formed on a head of the emitter 138 and may be comprised of an electrical insulator such as $Si_3N_4$.

The emitter 138 of the bipolar junction transistor 150 may be formed from a layer of a heavily-doped semiconductor material that is deposited and then patterned using lithography and etching processes. For example, the emitter 138 may be formed from polysilicon deposited by CVD or LPCVD and heavily doped with a concentration of a dopant, such as an impurities species from Group V of the Periodic Table, such as phosphorus (P), arsenic (As), to impart n-type conductivity. The heavy-doping level reduces the resistivity of the polysilicon and may be introduced by in situ doping that adds a dopant gas, such as phosphine or arsine, to the CVD reactant gases.

The lithography process forming the emitter 138 from the layer of heavily-doped semiconductor material may utilize photoresist and photolithography to form an etch mask that protects only a strip of the heavily-doped semiconductor material registered with the emitter opening 106. An etching process that stops on the material of layer 102 is selected to shape the emitter 138 from the protected strip of heavily-doped semiconductor material. The mask is subsequently removed to exposes the top surface 102a of dielectric layer 102.

The emitter 138 is electrically and physically coupled with the intrinsic base layer 16 by the semiconductor layer 116. The bottom part of the emitter 138, which is located inside the emitter opening 106, directly contacts the top surface 116a of the semiconductor layer 116 and indirectly contacts the top surface 16a of intrinsic base layer 16 due to the intervening semiconductor layer 116. The head of the emitter 138 protrudes out of the emitter opening 106 and includes lateral arms that partially overlap with the top surface 102a of dielectric layer 102. While depicted as flat in the representative embodiment, the top surface of the head of emitter 138 may include a divot.

The emitter 138 has a length, $L_4$, with a centerline that is transverse relative to respective centerlines of isolation structures 79-83 (and also relative to respective centerlines of trenches 26-30) along their respective lengths $L_1$, $L_2$ and is orthogonal to the respective centerlines of isolation structures 79-83 in the representative embodiment. Similarly, the centerline of the length, $L_4$, of emitter 138 is aligned transverse relative to respective centerlines of isolation structures 84-88 (and also relative to respective centerlines of trenches 31-35) along their respective lengths $L_1$, $L_2$ and is orthogonal to the respective centerlines of isolation structures 84-88 in the representative embodiment. The length, $L_4$, of the emitter 138 corresponds to its largest dimension in a plane normal to the top surface 10a.

Dielectric layers 100, 102 are patterned using the same etch mask used to form the emitter 138 and the optional dielectric cap 140, and an etching process, such as RIE, with suitable etch chemistries. The etch mask is removed after shaping the dielectric layers 100, 102.

The footprint of a bipolar junction transistor 150 on substrate 10 is fully defined by using conventional photolithography and etching processes to pattern the layers 16, 18, 98, 100, 102. Layers 16, 18, 98 are patterned to define an extrinsic base 152 of the bipolar junction transistor 150 from extrinsic base layer 98 and an intrinsic base 154 of the bipolar junction transistor 150 from intrinsic base layer 16. An etch mask is applied for use in a patterning process that relies on an etching process, such as a RIE process, with respective etch chemistries appropriate to etch the layers 16, 18, 98. Following the etching process, the etch mask is removed.

In one embodiment, the etching process patterning layers 16, 18, 98 may partially or completely remove portions of the intrinsic base layer 16 between the base dielectric layer 18 and sections 58-61 and may partially or completely remove portions of the intrinsic base layer 16 between the base dielectric layer 18 and sections 62-65 of substrate 10 to form cavities, such as the representative cavities 66, 67 visible in FIG. 9B. Cavity 66 operates to undercut the extrinsic base layer 98 and base dielectric layer 18 between the isolation structures 82, 83 and is bounded vertically between section 61 of the substrate 10 and the base dielectric layer 18. Cavity 67 operates to undercut the extrinsic base layer 98 and base dielectric layer 18 between the isolation structures 87, 88 and is bounded vertically between section 65 of the substrate 10 and the base dielectric layer 18. In the representative embodiment, cavity 66 extends across the entire distance (i.e., the width of section 61) between the neighboring isolation structures 82, 83, and cavity 67 extends across the entire distance (i.e., the width of section 65) between the neighboring isolation structures 87, 88. Cavity 66 may extend to the sidewall 72a of isolation region 72 and cavity 67 may extend to the sidewall 74a of isolation region 74. The isolation regions 72, 74 operate to prevent etching of the collector region 94. Similar cavities (not shown) may be formed by removing the intrinsic based layer 16 between adjacent pairs of isolation structures 79-82 and adjacent pairs of isolation structures 84-87.

However, the embodiments of the invention are not so limited because undercutting provided by the etching process may not remove all of the material of layer 16 between the adjacent pairs of isolation structures 79-83 and between the adjacent pairs of isolation structures 84-88, but may instead only extend partially across the width and length of the sections 58-61 and sections 62-65.

After patterning, the bipolar junction transistor 150 has a vertical architecture in which the intrinsic base 154 is located between the emitter 138 and the collector region 94, and the emitter 138, the intrinsic base 154, and the collector region 94 are vertically arranged. One p-n junction is defined at the interface between the emitter 138 and the intrinsic base 154. Another p-n junction is defined at the interface between the collector region 94 and the intrinsic base 154.

The conductivity types of the semiconductor material constituting the emitter 138 and the semiconductor materials constituting extrinsic base 152 and intrinsic base 154 are opposite. The semiconductor material of the intrinsic base 154, which may be $Si_xGe_{1-x}$ doped with boron and/or carbon, may have a narrower band gap than the materials (e.g., silicon) of the emitter 138 and collector region 94, in which case the bipolar junction transistor 150 includes a Si/SiGe heterojunction. The bipolar junction transistor 150 may comprise either an NPN device or a PNP device contingent upon the conductivity types of the emitter 138, intrinsic base 154, and collector region 94.

The isolation regions 76, 78 peripherally flanking the collector 94 replace shallow trench isolations that would otherwise be present in conventional constructions. The elimination of the shallow trench isolations eliminates facets from the intrinsic base layer 16 because the conventional layer thickness differential is eliminated. More specifically, the isolation regions 76, 78 are formed after the intrinsic base layer 16 is deposited, whereas the shallow trench isolations are formed in conventional constructions before the intrinsic base layer 16 is formed. Removing the facets from the active device region for the bipolar junction transistor 150 add more freedom in device design and layout, removes limitations on device area and scaling, and makes the bipolar junction transistor 150 generally flatter in topography to facilitate photolithography processes used in its fabrication.

During the front-end-of-line (FEOL) portion of the fabrication process, the device structure of the bipolar junction transistor 150 is replicated across at least a portion of the surface area of the substrate 10. In BiCMOS integrated circuits, complementary metal-oxide-semiconductor (CMOS) transistors (not shown) are formed using other regions of the substrate 10. As a result, both bipolar and CMOS transistors available on the same substrate 10.

Standard silicidation and standard back-end-of-line (BEOL) processing follows, which includes formation of contacts and wiring for the local interconnect structure, and formation of dielectric layers, via plugs, and wiring for an interconnect structure coupled by the interconnect wiring with the bipolar junction transistor 150, as well as other similar contacts for additional device structures like bipolar junction transistor 150 and CMOS transistors (not shown) included in other circuitry fabricated on the substrate 10. Other active and passive circuit elements, such as diodes, resistors, capacitors, varactors, and inductors, may be fabricated on substrate 10 and available for use in the BiCMOS integrated circuit.

Figure 10:
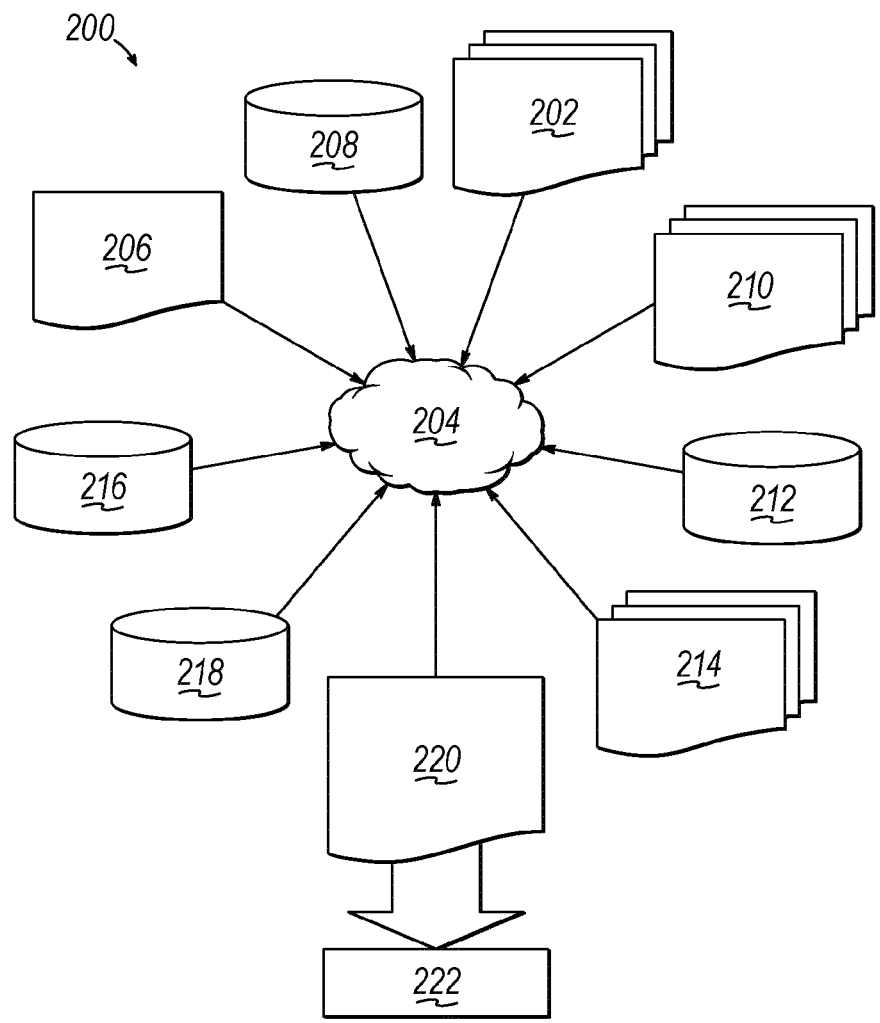
FIG. 10 is a flow diagram of a design process used in semiconductor design, manufacture, and/or test.

FIG. 10 shows a block diagram of an exemplary design flow 200 used for example, in semiconductor IC logic design, simulation, test, layout, and manufacture. Design flow 200 includes processes, machines and/or mechanisms for processing design structures or devices to generate logically or otherwise functionally equivalent representations of the design structures and/or devices described above and shown in FIGS. 9, 9A, 9B. The design structures processed and/or generated by design flow 200 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 200 may vary depending on the type of representation being designed. For example, a design flow 200 for building an application specific IC (ASIC) may differ from a design flow 200 for designing a standard component or from a design flow 200 for instantiating the design into a programmable array, for example a programmable gate array (PGA) or a field programmable gate array (FPGA) offered by Altera® Inc. or Xilinx® Inc.

FIG. 10 illustrates multiple such design structures including an input design structure 202 that is preferably processed by a design process 204. Design structure 202 may be a logical simulation design structure generated and processed by design process 204 to produce a logically equivalent functional representation of a hardware device. Design structure 202 may also or alternatively comprise data and/or program instructions that when processed by design process 204, generate a functional representation of the physical structure of a hardware device. Whether representing functional and/or structural design features, design structure 202 may be generated using electronic computer-aided design (ECAD) such as implemented by a core developer/designer. When encoded on a machine-readable data transmission, gate array, or storage medium, design structure 202 may be accessed and processed by one or more hardware and/or software modules within design process 204 to simulate or otherwise functionally represent an electronic component, circuit, electronic or logic module, apparatus, device, or system such as those shown in FIGS. 9, 9A, 9B. As such, design structure 202 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 204 preferably employs and incorporates hardware and/or software modules for synthesizing, translating, or otherwise processing a design/simulation functional equivalent of the components, circuits, devices, or logic structures shown in FIGS. 9, 9A, 9B to generate a netlist 206 which may contain design structures such as design structure 202. Netlist 206 may comprise, for example, compiled or otherwise processed data structures representing a list of wires, discrete components, logic gates, control circuits, I/O devices, models, etc. that describes the connections to other elements and circuits in an integrated circuit design. Netlist 206 may be synthesized using an iterative process in which netlist 206 is resynthesized one or more times depending on design specifications and parameters for the device. As with other design structure types described herein, netlist 206 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 204 may include hardware and software modules for processing a variety of input data structure types including netlist 206. Such data structure types may reside, for example, within library elements 208 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 210, characterization data 212, verification data 214, design rules 216, and test data files 218 which may include input test patterns, output test results, and other testing information. Design process 204 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 204 without deviating from the scope and spirit of the invention. Design process 204 may also include modules for performing standard circuit design processes such as timing analysis, verification, design rule checking, place and route operations, etc.

Design process 204 employs and incorporates logic and physical design tools such as HDL compilers and simulation model build tools to process design structure 202 together with some or all of the depicted supporting data structures along with any additional mechanical design or data (if applicable), to generate a second design structure 220. Design structure 220 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 202, design structure 220 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 9, 9A, 9B. In one embodiment, design structure 220 may comprise a compiled, executable HDL simulation model that functionally simulates the devices shown in FIGS. 9, 9A, 9B.

Design structure 220 may also employ a data format used for the exchange of layout data of integrated circuits and/or symbolic data format (e.g. information stored in a GDSII (GDS2), GL1, OASIS, map files, or any other suitable format for storing such design data structures). Design structure 220 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 9, 9A, 9B. Design structure 220 may then proceed to a stage 222 where, for example, design structure 220: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It will be understood that when an element is described as being "connected" or "coupled" to or with another element, it can be directly connected or coupled to the other element or, instead, one or more intervening elements may be present. In contrast, when an element is described as being "directly connected" or "directly coupled" to another element, there are no intervening elements present. When an element is described as being "indirectly connected" or "indirectly coupled" to another element, there is at least one intervening element present.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device structure for a bipolar junction transistor, the device structure comprising:
    a collector region of the bipolar junction transistor in a substrate;
    a plurality of first isolation structures extending into the substrate and comprised of an electrical insulator, the first isolation structures having a length and arranged with a first pitch transverse to the length such that each adjacent pair of the first isolation structures is separated by a respective first section of the substrate;
    an intrinsic base of the bipolar junction transistor on a first portion of the collector region; and
    an emitter of the bipolar junction transistor on the intrinsic base, the emitter having a length transversely oriented relative to the length of the first isolation structures.

2. The device structure of claim 1 further comprising:
    a first isolation region in the substrate, the first isolation region laterally separated from at least one of the first isolation structures by a second portion of the collector region, and the first isolation region laterally separating the second portion of the collector region from the first portion of the collector region.

3. The device structure of claim 2 wherein the first isolation region is comprised of the electrical insulator, and the first isolation region and the first isolation structures extend through the intrinsic base.

4. The device structure of claim 2 wherein the first isolation structures are aligned transverse to a length of the first isolation region.

5. The device structure of claim 2 wherein at least one of the first isolation structures is not separated by the second portion of the collector region from the first isolation region.

6. The device structure of claim 2 further comprising:
    a second isolation region in the collector region;
    a plurality of second isolation structures extending into the substrate and comprised of the electrical insulator, the second isolation structures having a length and arranged with a second pitch transverse to the length such that each adjacent pair of the second isolation structures is separated by a respective second section of the substrate.

7. The device structure of claim 6 wherein the second isolation structures are aligned transverse to a length of the second isolation region.

8. The device structure of claim 6 wherein the first isolation structures are separated from the second isolation structures by the first isolation region and the second isolation region.

9. The device structure of claim 1 wherein the first isolation structures extend through the intrinsic base.

10. The device structure of claim 1 wherein the intrinsic base is vertically positioned between the emitter and the collector region so that the collector region, the intrinsic base, and the emitter have a vertical arrangement.

11. The device structure of claim 10 wherein the first isolation structures extend through the intrinsic base.

12. The device structure of claim 1 further comprising:
a base dielectric layer on the intrinsic base; and
an extrinsic base on the base dielectric layer and the first isolation structures.

13. The device structure of claim 12 further comprising:
a cavity laterally positioned between an adjacent pair of the first isolation structures and vertically positioned between the base dielectric layer and the substrate.

14. The device structure of claim 1 wherein the bipolar junction transistor includes a first heterojunction between the intrinsic base and the emitter, a second heterojunction between the intrinsic base and the collector region, or a combination thereof.

15. A hardware description language (HDL) design structure encoded on a machine-readable data storage medium, the HDL design structure comprising elements that when processed in a computer-aided design system generates a machine-executable representation of a bipolar junction transistor, the HDL design structure comprising:

a collector region of the bipolar junction transistor in a substrate;
a plurality of isolation structures extending into the substrate and comprised of an electrical insulator, the isolation structures having a length and arranged with a pitch transverse to the length such that each adjacent pair of the isolation structures is separated by a respective section of the substrate;
an intrinsic base of the bipolar junction transistor on a portion of the collector region; and
an emitter of the bipolar junction transistor on the intrinsic base, the emitter having a length transversely oriented relative to the length of the isolation structures.

16. The HDL design structure of claim 15 wherein the HDL design structure comprises a netlist.

17. The HDL design structure of claim 15 wherein the HDL design structure resides on storage medium as a data format used for the exchange of layout data of integrated circuits.

18. The HDL design structure of claim 15 wherein the HDL design structure resides in a programmable gate array.

19. The HDL design structure of claim 15 wherein the bipolar junction transistor includes a first heterojunction between the intrinsic base and the emitter, a second heterojunction between the intrinsic base and the collector region, or a combination thereof.

* * * * *